United States Patent
Lu et al.

(10) Patent No.: US 11,737,209 B2
(45) Date of Patent: Aug. 22, 2023

(54) CIRCUIT BOARD AND MANUFACTURING METHOD THEREOF AND ELECTRONIC DEVICE

(71) Applicant: Unimicron Technology Corp., Taoyuan (TW)

(72) Inventors: Chih-Chiang Lu, New Taipei (TW); Chi-Min Chang, Taoyuan (TW); Shao-Chien Lee, Taipei (TW); Jun-Rui Huang, Tainan (TW); Ming-Ting Chang, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 105 days.

(21) Appl. No.: 17/574,551

(22) Filed: Jan. 13, 2022

(65) Prior Publication Data
US 2022/0240369 A1     Jul. 28, 2022

Related U.S. Application Data

(60) Provisional application No. 63/241,512, filed on Sep. 7, 2021, provisional application No. 63/139,795, filed on Jan. 21, 2021.

(30) Foreign Application Priority Data

Nov. 19, 2021   (TW) ................ 110143144

(51) Int. Cl.
*H05K 1/02*     (2006.01)
*H05K 3/42*     (2006.01)
(Continued)

(52) U.S. Cl.
CPC ............ *H05K 1/024* (2013.01); *H05K 1/115* (2013.01); *H05K 3/0011* (2013.01); *H05K 3/10* (2013.01); *H05K 3/42* (2013.01); *H05K 3/4602* (2013.01); *H05K 2201/0183* (2013.01); *H05K 2201/09209* (2013.01); *H05K 2203/0502* (2013.01)

(58) Field of Classification Search
CPC .... H05K 1/024; H05K 1/0251; H05K 1/0253; H05K 1/0254; H05K 1/0256; H05K 3/4602; H05K 3/42; H05K 3/421
See application file for complete search history.

(56) References Cited

U.S. PATENT DOCUMENTS

2015/0014045 A1    1/2015   Brigham et al.

FOREIGN PATENT DOCUMENTS

TW          201918134         5/2019

*Primary Examiner* — Jeremy C Norris
(74) *Attorney, Agent, or Firm* — JCIPRNET

(57) ABSTRACT

A circuit board includes a first dielectric material, a second dielectric material, a third dielectric material, a first external circuit layer, a second external circuit layer, multiple conductive structures, and a conductive via structure. Dielectric constants of the first, the second and the third dielectric materials are different. The first and the second external circuit layers are respectively disposed on the first and the third dielectric materials. The conductive via structure at least penetrates the first and the second dielectric materials and is electrically connected to the first and the second external circuit layers to define a signal path. The conductive structures are electrically connected to each other and surround the first, the second and the third dielectric materials. The conductive structures are electrically connected to the first and the second external circuit layers to define a ground path surrounding the signal path.

43 Claims, 39 Drawing Sheets

(51) Int. Cl.
*H05K 3/46* (2006.01)
*H05K 1/11* (2006.01)
*H05K 3/00* (2006.01)
*H05K 3/10* (2006.01)

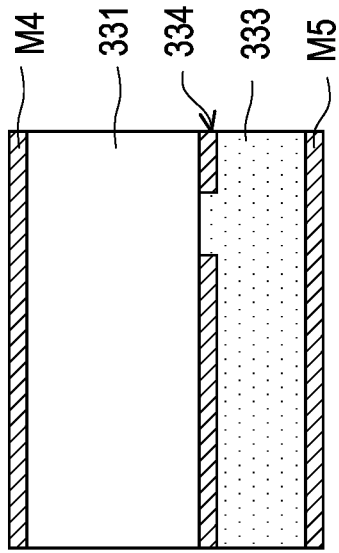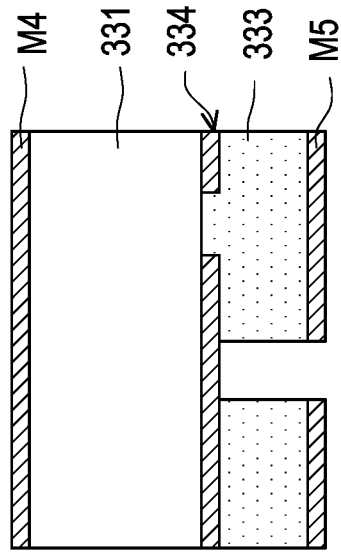
FIG. 7C
FIG. 7D
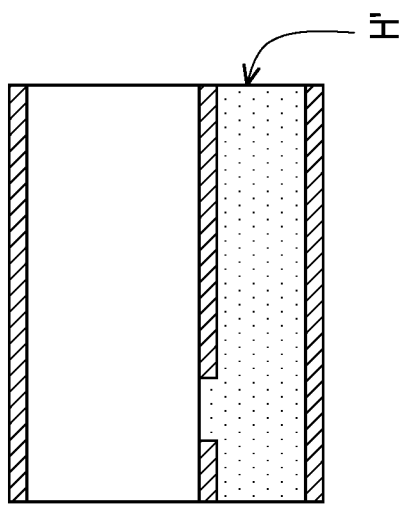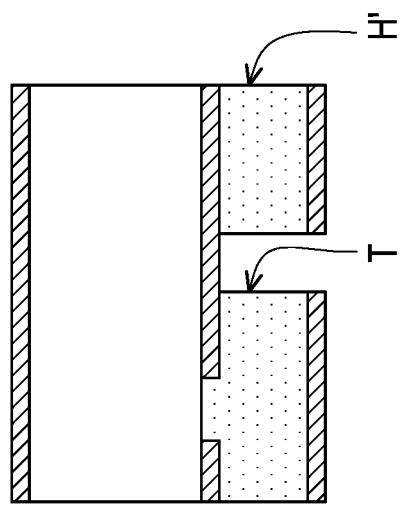

CIRCUIT BOARD AND MANUFACTURING METHOD THEREOF AND ELECTRONIC DEVICE

CROSS-REFERENCE TO RELATED APPLICATION

This application claims the priority benefits of U.S. provisional application Ser. No. 63/139,795, filed on Jan. 21, 2021 and 63/241,512, filed on Sep. 7, 2021, and Taiwan application serial no. 110143144, filed on Nov. 19, 2021. The entirety of each of the above-mentioned patent applications is hereby incorporated by reference herein.

BACKGROUND

Technical Field

The disclosure relates to a substrate structure and a manufacturing method thereof, and in particular, to a circuit board and a manufacturing method thereof and an electronic device adopting the circuit board.

Description of Related Art

In a conventional circuit board, a design of a coaxial via requires one or more insulating layer between an internal conductor layer and an external conductor layer for isolation. The insulating layer is formed through press-fitting and a build-up process. Therefore, impedance mismatch and electromagnetic interference (EMI) may occur to block a notch at the two ends of the coaxial via, affecting high-frequency signal integrity. In addition, in the design of the coaxial via, the two ends of a signal path and the two ends of a ground path are respectively located on different planes, and noise interference cannot be reduced.

SUMMARY

The disclosure is directed to a circuit board having a good signal circuit and exhibiting favorable signal integrity.

The disclosure further provides a manufacturing method of a circuit board to manufacture the circuit board.

The circuit board of the disclosure includes a first dielectric material, a second dielectric material, a third dielectric material, a first external circuit layer, a second external circuit layer, multiple conductive structures and a conductive via structure. The second dielectric material is located between the first dielectric material and the third dielectric material, and a dielectric constant of the first dielectric material is different from a dielectric constant of the second dielectric material and a dielectric constant of the third dielectric material. The first external circuit layer is disposed on the first dielectric material. The second external circuit layer is disposed on the third dielectric material. The conductive via structure at least penetrates the first dielectric material and the second dielectric material and is electrically connected to the first external circuit layer and the second external circuit layer to define a signal path. The conductive structures are electrically connected to each other and surround the first dielectric material, the second dielectric material, and the third dielectric material. The conductive structures are electrically connected to the first external circuit layer and the second external circuit layer to define a ground path. The ground path surrounds the signal path.

In an embodiment of the disclosure, the conductive structures include multiple first conductive pillars, multiple second conductive pillars, a first circuit layer, a second circuit layer, and a conductive connection layer. The first conductive pillars surround the first dielectric material, and the second conductive pillars surround the third dielectric material. The conductive connection layer is connected to the first circuit layer and the second circuit layer and surrounds the second dielectric material.

In an embodiment of the disclosure, the circuit board further includes a first base material, a second base material, and a third material. The first base material includes a first substrate, the first dielectric material, and the first conductive pillars. The first dielectric material and the first conductive pillars penetrate the first substrate, and the first conductive pillars are located between the first substrate and the first dielectric material. The second base material includes a second substrate, the second dielectric material, the first circuit layer, the second circuit layer, and the conductive connection layer. The second substrate has a first surface and a second surface opposite to each other and an opening, and the opening penetrates the second substrate. The first circuit layer and the second circuit layer are respectively located on the first surface and the second surface. The conductive connection layer covers an inner wall of the opening and is electrically connected to the first circuit layer and the second circuit layer. The opening is fully filled with the second dielectric material. The third base material includes a third substrate, the third dielectric material, and the second conductive pillars. The third dielectric material and the second conductive pillars penetrate the third substrate, and the second conductive pillars are located between the third substrate and the third dielectric material.

In an embodiment of the disclosure, the first external circuit layer includes a first signal circuit and a first ground circuit. The second external circuit layer includes a second signal circuit and a second ground circuit. The first signal circuit, the conductive via structure, and the second signal circuit define the signal path. The first ground circuit, the first conductive pillars, the first circuit layer, the conductive connection layer, the second circuit layer, the second conductive pillars, and the second ground circuit define the ground path.

In an embodiment of the disclosure, the conductive via structure includes a via and a conductive material layer. The via penetrates the first dielectric material, the second dielectric material, and the third dielectric material. The conductive material layer covers an inner wall of the via and is electrically connected to the first external circuit layer and the second external circuit layer.

In an embodiment of the disclosure, the conductive via structure further includes a dielectric layer fully filling the via. An upper surface and a lower surface of the dielectric layer that are opposite to each other are respectively flush with a top surface of the first external circuit layer and a bottom surface of the second external circuit layer.

In an embodiment of the disclosure, the conductive via structure further includes a dielectric layer fully filling the via. The first external circuit layer and the second external circuit layer respectively cover an upper surface and a lower surface of the dielectric layer that are opposite to each other.

In an embodiment of the disclosure, a dielectric constant of the first substrate and a dielectric constant of the third substrate are respectively greater than 3.6, and a dielectric dissipation factor (Df) of the first substrate and s dielectric dissipation factor of the third substrate are respectively less than 0.02.

In an embodiment of the disclosure, the conductive structures include the multiple first conductive pillars, the multiple second conductive pillars, the first circuit layer, the second circuit layer, a third circuit layer, and the conductive connection layer. The first conductive pillars surround the first dielectric material, and the second conductive pillars surround the third dielectric material. The second circuit layer is located between the first circuit layer and the third circuit layer, and the conductive connection layer is connected to the first circuit layer, the second circuit layer, and the third circuit layer and surrounds the second dielectric material.

In an embodiment of the disclosure, the circuit board further includes the first base material and the second base material. The first base material includes a first substrate, the first dielectric material, and the first conductive pillars. The first dielectric material and the first conductive pillars penetrate the first substrate, and the first conductive pillars are located between the first substrate and the first dielectric material. The second base material includes the second substrate, the third substrate, the second dielectric material, the third dielectric material, the first circuit layer, the second circuit layer, the third circuit layer, the conductive connection layer, the second conductive pillars, and the opening. The second substrate has the first surface and the second surface opposite to each other. The first circuit layer and the second circuit layer are respectively located on the first surface and the second surface. The third substrate and the third dielectric material are located on the second surface of the second substrate. The third circuit layer is located on the third substrate and the third dielectric material. The second conductive pillars are electrically connected to the second circuit layer and the third circuit layer. The opening penetrates the second substrate and the third dielectric material. The conductive connection layer covers the inner wall of the opening and is electrically connected to the first circuit layer, the second circuit layer, and the third circuit layer. The opening is fully filled with the second dielectric material.

In an embodiment of the disclosure, the first external circuit layer includes the first signal circuit and the first ground circuit. The second external circuit layer includes the second signal circuit and the second ground circuit. The first signal circuit, the conductive via structure, and the second signal circuit define the signal path. The first ground circuit, the first conductive pillars, the first circuit layer, the conductive connection layer, and the second ground circuit define the ground path.

In an embodiment of the disclosure, the conductive via structure includes the via and the conductive material layer. The via penetrates the first dielectric material and the second dielectric material. The conductive material layer covers the inner wall of the via and is electrically connected to the first external circuit layer and the second external circuit layer.

In an embodiment of the disclosure, the conductive via structure further includes a dielectric layer fully filling the via. An upper surface and a lower surface of the dielectric layer that are opposite to each other are respectively flush with the top surface of the first external circuit layer and the bottom surface of the second external circuit layer.

In an embodiment of the disclosure, a dielectric constant of the dielectric layer is greater than 3.6, and a dielectric dissipation factor of the dielectric layer is less than 0.05.

In an embodiment of the disclosure, the conductive via structure further includes the dielectric layer fully filling the via. The first external circuit layer and the second external circuit layer respectively cover an upper surface and a lower surface of the dielectric layer that are opposite to each other.

In an embodiment of the disclosure, a dielectric constant of the dielectric layer is greater than 3.6, and a dielectric dissipation factor of the dielectric layer is less than 0.05.

In an embodiment of the disclosure, the conductive structures include the multiple first conductive pillars, multiple conductive vias, the first circuit layer, the second circuit layer, the third circuit layer, and the conductive connection layer. The first conductive pillars surround the first dielectric material, and the conductive vias penetrate the third dielectric material. The second circuit layer is located between the first circuit layer and the third circuit layer. The conductive connection layer is connected to the first circuit layer, the second circuit layer, and the third circuit layer and surrounds the second dielectric material.

In an embodiment of the disclosure, the circuit board further includes the first base material and the second base material. The first base material includes the first substrate, the first dielectric material, and the first conductive pillars. The first dielectric material and the first conductive pillars penetrate the first substrate, and the first conductive pillars are located between the first substrate and the first dielectric material. The second base material includes the second substrate, the second dielectric material, the third dielectric material, the first circuit layer, the second circuit layer, the third circuit layer, the conductive connection layer, the conductive vias, and the opening. The second substrate has the first surface and the second surface opposite to each other. The first circuit layer and the second circuit layer are respectively located on the first surface and the second surface. The third dielectric material is located on the second surface of the second substrate. The third circuit layer is located on the third dielectric material. The conductive vias are electrically connected to the second circuit layer and the third circuit layer. The opening penetrates the second substrate and the third dielectric material. The conductive connection layer covers the inner wall of the opening and is electrically connected to the first circuit layer, the second circuit layer, and the third circuit layer. The opening is fully filled with the second dielectric material.

In an embodiment of the disclosure, the first external circuit layer includes the first signal circuit and the first ground circuit. The second external circuit layer includes the second signal circuit and the second ground circuit. The first signal circuit, the conductive via structure, and the second signal circuit define the signal path. The first ground circuit, the first conductive pillars, the first circuit layer, the conductive connection layer, and the second ground circuit define the ground path.

In an embodiment of the disclosure, the conductive via structure includes the via and the conductive material layer. The via penetrates the first dielectric material and the second dielectric material. The conductive material layer covers the inner wall of the via and is electrically connected to the first external circuit layer and the second external circuit layer.

In an embodiment of the disclosure, the conductive via structure further includes a dielectric layer fully filling the via. An upper surface and a lower surface of the dielectric layer that are opposite to each other are respectively flush with the top surface of the first external circuit layer and the bottom surface of the second external circuit layer.

In an embodiment of the disclosure, the conductive via structure further includes a dielectric layer fully filling the via. The first external circuit layer and the second external circuit layer respectively cover an upper surface and a lower surface of the dielectric layer that are opposite to each other.

In an embodiment of the disclosure, a dielectric dissipation factor of the first dielectric material and a dielectric dissipation factor of the third dielectric material are respectively greater than 0 and less than 0.006, and a dielectric dissipation factor of the second dielectric material is greater than 0 and less than 0.008.

The manufacturing method of the circuit board of the disclosure includes the following. Multiple conductive structures are formed to surround a first dielectric material, a second dielectric material, and a third dielectric material. The first dielectric material, the second dielectric material, and the third dielectric material are press-fitted. The second dielectric material is located between the first dielectric material and the third dielectric material, and a dielectric constant of the first dielectric material is different from a dielectric constant of the second dielectric material and a dielectric constant of the third dielectric material. The conductive structures are electrically connected to each other. A conductive via structure is formed to at least penetrate the first dielectric material and the second dielectric material. A first external circuit layer and a second external circuit layer are formed respectively on the first dielectric material and the third dielectric material. The first external circuit layer, the second external circuit layer, and the conductive via structure are electrically connected to define a signal path. The conductive structures are electrically connected to the first external circuit layer and the second external circuit layer to define a ground path. The ground path surrounds the signal path.

In an embodiment of the disclosure, the conductive structure includes multiple first conductive pillars, multiple second conductive pillars, a first circuit layer, a second circuit layer, and a conductive connection layer. The first conductive pillars surround the first dielectric material, and the second conductive pillars surround the third dielectric material. The conductive connection layer is connected to the first circuit layer and the second circuit layer and surrounds the second dielectric material.

In an embodiment of the disclosure, forming the conductive structures to surround the first dielectric material, the second dielectric material, and the third dielectric material includes the following. A first base material is provided. The first base material includes a first substrate, the first dielectric material, and the first conductive pillars. The first dielectric material and the first conductive pillars penetrate the first substrate, and the first conductive pillars are located between the first substrate and the first dielectric material. A second base material is provided. The second base material includes a second substrate, the second dielectric material, the first circuit layer, the second circuit layer, and the conductive connection layer. The second substrate has a first surface and a second surface opposite to each other and an opening, and the opening penetrates the second substrate. The first circuit layer and the second circuit layer are respectively located on the first surface and the second surface. The conductive connection layer covers an inner wall of the opening and is electrically connected to the first circuit layer and the second circuit layer. The opening is fully filled with the second dielectric material. A third base material is provided. The third base material includes a third substrate, the third dielectric material, and the second conductive pillars. The third dielectric material and the second conductive pillars penetrate the third substrate, and the second conductive pillars are located between the third substrate and the third dielectric material.

In an embodiment of the disclosure, forming the conductive via structure to at least penetrate the first dielectric material and the second dielectric material includes the following. A via is formed to penetrate the first dielectric material, the second dielectric material, and the third dielectric material. A conductive material layer is formed to cover an inner wall of the via.

In an embodiment of the disclosure, forming the first external circuit layer and the second external circuit layer respectively on the first dielectric material and the third dielectric material includes the following. When the first dielectric material, the second dielectric material, and the third dielectric material are press-fitted, a first metal layer and a second metal layer are respectively press-fitted on the first base material and the third base material. When the conductive material layer is formed, the conductive material layer further extends to cover on the first metal layer and the second metal layer. The conductive material layer, the first metal layer, and the second metal layer are patterned to form the first external circuit layer and the second external circuit layer.

In an embodiment of the disclosure, the manufacturing method of the circuit board of the disclosure further includes the following. After the conductive material layer is formed and before the conductive material layer, the first metal layer, and the second metal layer are patterned, a dielectric layer is filled in the via. The via is fully filled with the dielectric layer, and an upper surface and a lower surface of the dielectric layer that are opposite to each other are respectively flush with a top surface and a bottom surface of the conductive material layer.

In an embodiment of the disclosure, the manufacturing method of the circuit board of the disclosure further includes the following. After the dielectric layer is filled in the via and before the conductive material layer, the first metal layer, and the second metal layer are patterned, a capping layer is formed on the conductive material layer. The capping layer covers the conductive material layer and the upper surface and the lower surface of the dielectric layer. The capping layer, the conductive material layer, the first metal layer, and the second metal layer are patterned to form the first external circuit layer and the second external circuit layer.

In an embodiment of the disclosure, the conductive structures include the multiple first conductive pillars, the multiple second conductive pillars, the first circuit layer, the second circuit layer, a third circuit layer, and the conductive connection layer. The first conductive pillars surround the first dielectric material, and the second conductive pillars surround the third dielectric material. The second circuit layer is located between the first circuit layer and the third circuit layer. The conductive connection layer is connected to the first circuit layer, the second circuit layer, and the third circuit layer and surrounds the second dielectric material.

In an embodiment of the disclosure, forming the conductive structures to surround the first dielectric material, the second dielectric material, and the third dielectric material includes the following. The first base material is formed. The first base material includes the first substrate, the first dielectric material, and the first conductive pillars. The first dielectric material and the first conductive pillars penetrate the first substrate, and the first conductive pillars are located between the first substrate and the first dielectric material. The second base material is provided. The second base material includes the second substrate, the third substrate, the second dielectric material, the third dielectric material, the first circuit layer, the second circuit layer, the third circuit layer, the conductive connection layer, the second conductive pillars, and the opening. The second substrate has the first surface and the second surface opposite to each other. The first circuit layer and the second circuit layer are respectively located on the first surface and the second surface. The third substrate and the third dielectric material are located on the second surface of the second substrate, and the third circuit layer is located on the third substrate and the third dielectric material. The second conductive pillars are electrically connected to the second circuit layer and the third circuit layer. The opening penetrates the second substrate and the third dielectric material. The conductive connection layer covers the inner wall of the opening and is electrically connected to the first circuit layer, the second circuit layer, and the third circuit layer. The opening is fully filled with the second dielectric material.

In an embodiment of the disclosure, forming the conductive via structure to at least penetrate the first dielectric material and the second dielectric material includes the following. The via is formed to penetrate the first dielectric material and the second dielectric material. The conductive material layer is formed to cover the inner wall of the via.

In an embodiment of the disclosure, forming the first external circuit layer and the second external circuit layer respectively on the first dielectric material and the third dielectric material includes the following. When the first dielectric material, the second dielectric material, and the third dielectric material are press-fitted, a metal layer is press-fitted on the first base material. When the conductive material layer is formed, the conductive material layer further extends to cover on the metal layer and the third circuit layer. The conductive material layer and the metal layer are patterned to form the first external circuit layer and the second external circuit layer.

In an embodiment of the disclosure, the manufacturing method of the circuit board of the disclosure further includes the following. After the conductive material layer is formed and before the conductive material layer and the metal layer are patterned, a dielectric layer is filled in the via. The via is fully filled with the dielectric layer, and an upper surface and a lower surface of the dielectric layer that are opposite to each other are respectively flush with the top surface and the bottom surface of the conductive material layer.

In an embodiment of the disclosure, the manufacturing method of the circuit board of the disclosure further includes the following. After the dielectric layer is filled in the via and before the conductive material layer and the metal layer are patterned, a capping layer is formed on the conductive material layer. The capping layer covers the conductive material layer and the upper surface and the lower surface of the dielectric layer. The capping layer, the conductive material layer, and the metal layer are patterned to form the first external circuit layer and the second external circuit layer.

In an embodiment of the disclosure, the conductive structures include the multiple first conductive pillars, multiple conductive vias, the first circuit layer, the second circuit layer, the third circuit layer, and the conductive connection layer. The first conductive pillars surround the first dielectric material, and the conductive vias penetrate the third dielectric material. The second circuit layer is located between the first circuit layer and the third circuit layer. The conductive connection layer is connected to the first circuit layer, the second circuit layer, and the third circuit layer and surrounds the second dielectric material.

In an embodiment of the disclosure, forming the conductive structures to surround the first dielectric material, the second dielectric material, and the third dielectric material includes the following. The first base material is formed. The first base material includes the first substrate, the first dielectric material, and the first conductive pillars. The first dielectric material and the first conductive pillars penetrate the first substrate, and the first conductive pillars are located between the first substrate and the first dielectric material. The second base material is formed. The second base material includes the second substrate, the second dielectric material, the third dielectric material, the first circuit layer, the second circuit layer, the third circuit layer, the conductive connection layer, the conductive vias, and the opening. The second substrate has the first surface and the second surface opposite to each other. The first circuit layer and the second circuit layer are respectively located on the first surface and the second surface. The third dielectric material is located on the second surface of the second substrate, and the third circuit layer is located on the third dielectric material. The conductive vias are electrically connected to the second circuit layer and the third circuit layer. The opening penetrates the second substrate and the third dielectric material. The conductive connection layer covers the inner wall of the opening and is electrically connected to the first circuit layer, the second circuit layer, and the third circuit layer. The opening is fully filled with the second dielectric material.

In an embodiment of the disclosure, forming the conductive via structure to at least penetrate the first dielectric material and the second dielectric material includes the following. The via is formed to penetrate the first dielectric material and the second dielectric material. The conductive material layer is formed to cover the inner wall of the via.

In an embodiment of the disclosure, forming the first external circuit layer and the second external circuit layer respectively on the first dielectric material and the third dielectric material includes the following. When the first dielectric material, the second dielectric material, and the third dielectric material are press-fitted, a metal layer is press-fitted on the first base material. When the conductive material layer is formed, the conductive material layer further extends to cover on the metal layer and the third circuit layer. The conductive material layer and the metal layer are patterned to form the first external circuit layer and the second external circuit layer.

In an embodiment of the disclosure, the manufacturing method of the circuit board of the disclosure further includes the following. After the conductive material layer is formed and before the conductive material layer and the metal layer are patterned, a dielectric layer is filled in the via. The via is fully filled with the dielectric layer, and an upper surface and a lower surface of the dielectric layer that are opposite to each other are respectively flush with the top surface and the bottom surface of the conductive material layer.

In an embodiment of the disclosure, the manufacturing method of the circuit board of the disclosure further includes the following. After the dielectric layer is filled in the via and before the conductive material layer and the metal layer are patterned, the capping layer is formed on the conductive material layer. The capping layer covers the conductive material layer and the upper surface and the lower surface of the dielectric layer. The capping layer, the conductive material layer, and the metal layer are patterned to form the first external circuit layer and the second external circuit layer.

The electronic device of the disclosure includes a circuit board and an electronic element. The circuit board includes a first dielectric material, a second dielectric material, a third dielectric material, a first external circuit layer, a second external circuit layer, multiple conductive structures and a conductive via structure. The second dielectric material is located between the first dielectric material and the third dielectric material, and a dielectric constant of the first dielectric material is different from a dielectric constant of the second dielectric material and a dielectric constant of the third dielectric material. The first external circuit layer is disposed on the first dielectric material. The second external circuit layer is disposed on the third dielectric material. The conductive via structure at least penetrates the first dielectric material and the second dielectric material and is electrically connected to the first external circuit layer and the second external circuit layer to define a signal path. The conductive structures are electrically connected to each other and surround the first dielectric material, the second dielectric material, and the third dielectric material. The conductive structures are electrically connected to the first external circuit layer and the second external circuit layer to define a ground path. The ground path surrounds the signal path. The electronic element is electrically connected to the circuit board.

Based on the above, in the design of the circuit board of the disclosure, the conductive via structure is electrically connected to the first external circuit layer and the second external circuit layer to define the signal path. The conductive structures are electrically connected to each other and are electrically connected to the first external circuit layer and the second external circuit layer to define the ground path. The ground path surrounds the signal path. Hence, a favorable high-frequency and high speed signal circuit may be formed, and in further application of integrated circuit and antennas, signal interference on the same plane may be eliminated. Signal energy loss may and noise interference may be reduced to enhance the reliability of signal transmission. In addition, the conductive via structure of the disclosure at least penetrates the first dielectric material and the second dielectric material. That is, by providing dielectric materials with different dielectric constants around the conductive via structure, signal transmission speed may be increased and signal transmission loss may be reduced.

In order to make the aforementioned features and advantages of the disclosure comprehensible, embodiments accompanied with drawings are described in detail below.

BRIEF DESCRIPTION OF THE DRAWINGS

FIG. 7A to FIG. 7L are schematic cross-sectional diagrams of another manufacturing method of a circuit board according to another embodiment of the disclosure.

DESCRIPTION OF THE EMBODIMENTS

Figure 1A:
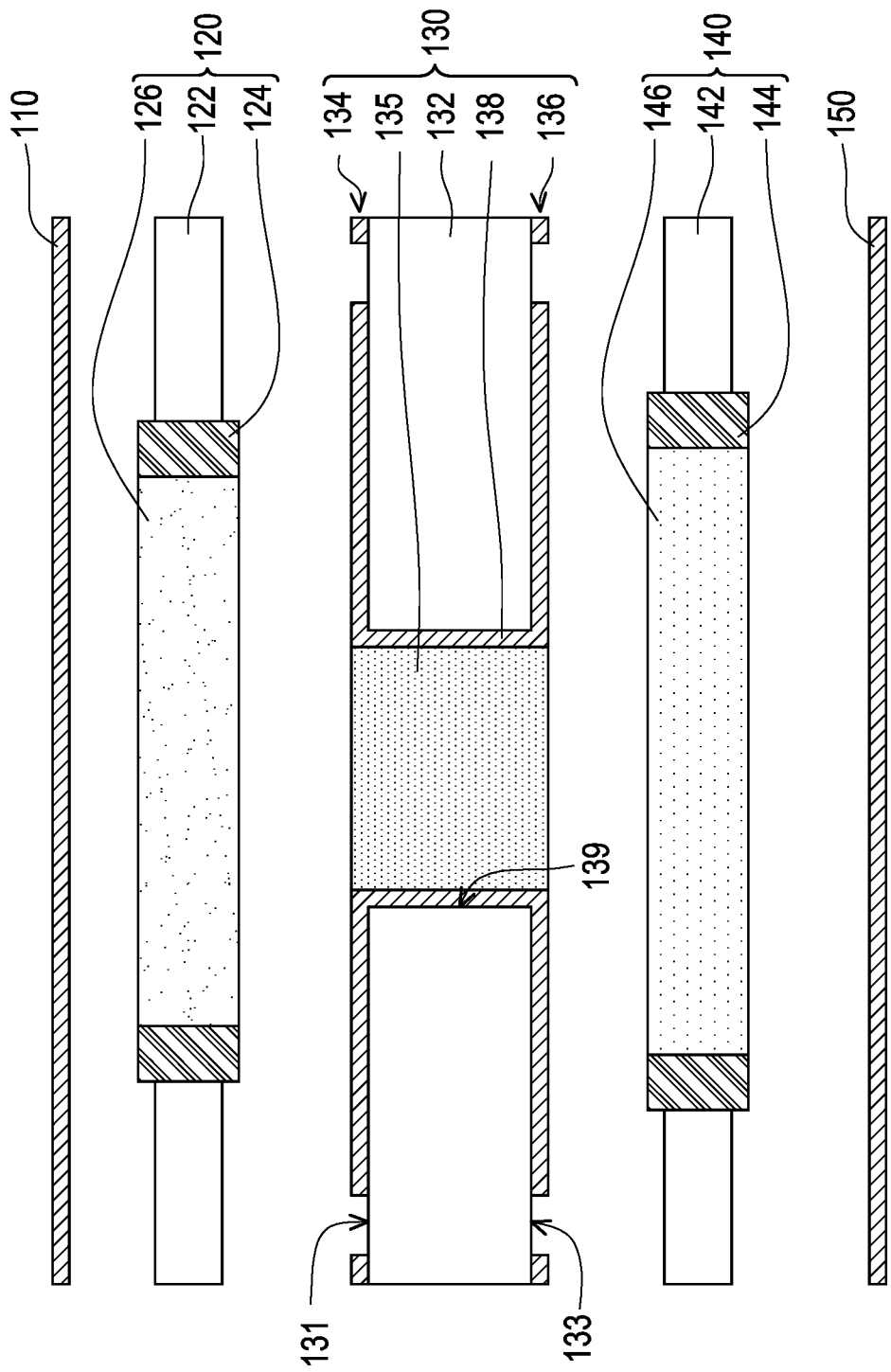
FIG. 1A to FIG. 1E are schematic cross-sectional diagrams of a manufacturing method of a circuit board according to an embodiment of the disclosure.

FIG. 1A to FIG. 1E are schematic cross-sectional diagrams of a manufacturing method of a circuit board according to an embodiment of the disclosure. FIG. 1F is a top-view of a circuit board of FIG. 1E. In the manufacturing method of the circuit board according to the embodiment, referring to FIG. 1A, a first metal layer 110, a first base material 120, a second base material 130, a third base material 140, and a second metal layer 150 are provided. The first base material 120 includes a first substrate 122, first conductive pillars 124, and a first dielectric material 126. The first dielectric material 126 and the first conductive pillars 124 penetrate the first substrate 122, and the first conductive pillars 124 are located between the first substrate 122 and the first dielectric material 126. The first conductive pillars 124 surround the first dielectric material 126. Providing the first base material 120 includes the following. First, the first substrate 122 is provided. The first substrate 122 is currently in a B phase state. That is, the first substrate 122 is not completely cured. A material of the first substrate 122 is, for example but not limited to, epoxy, polytetrafluoroethylene (PTFE), polyphenylene ether (PPE), polyimide (PI), bismaleimide triazine (BT) resin, phenolic novolac (PN) resin, or hydrocarbon. Next, release films may be attached to two opposite sides of the first substrate 122. A material of the release films is, for example, polyethylene terephthalate (PET). Next, routing is performed on the first substrate 122 to form a via. Next, the via is filled with the first dielectric material 126. Two opposite sides of the first dielectric material 126 are respectively flush with the release films. Next, a drilling process is performed on the first dielectric material 126 to form the via. The drilling process is, for example but not limited to, laser drilling, mechanical drilling, or punching. The via is filled with a conductive adhesive through printing or injection to form the first conductive pillars 124 surrounding the first dielectric material 126. Next, the release films attached to the two opposite sides of the first substrate 122 are removed so that two opposite surfaces of the first conductive pillars 124 and the first dielectric material 126 respectively protrude out of two opposite surfaces of the first substrate 122, and the manufacture of the first base material 120 is completed.

In addition, the second base material 130 includes a second substrate 132, a second dielectric material 135, a first circuit layer 134, a second circuit layer 136, and a conductive connection layer 138. The second substrate 132 has a first surface 131 and a second surface 133 opposite to each other and an opening 139, and the opening 139 penetrates the second substrate 132. The first circuit layer 134 and the second circuit layer 136 are respectively located on the first surface 131 and the second surface 133. The conductive connection layer 138 covers an inner wall of the opening 139 and is electrically connected to the first circuit layer 134 and the second circuit layer 136. The opening 139 is fully filled with the second dielectric material 135, and the conductive connection layer 138 surrounds the second dielectric material 135. The third base material 140 includes a third substrate 142, second conductive pillars 144, and a third dielectric material 146. The third dielectric material 146 and the second conductive pillars 144 penetrate the third substrate 142, and the second conductive pillars 144 are located between the third substrate 142 and the third dielectric material 146. The second conductive pillars 144 surround the third dielectric material 146. Referring to the manufacturing method of the first base material 120 above, the manufacturing method of the third base material 140 and the first base material 120 are the same, and it is not repeated. Note that the first conductive pillars 124, the second conductive pillars 144, the first circuit layer 134, the second circuit layer 136, and the conductive connection layer 138 may be viewed as multiple conductive structures, and the multiple conductive structures surrounding the first dielectric material 126, the second dielectric material 135, and the third dielectric material 146 are formed here. Here, the first metal layer 110, the first base material 120, the second base material 130, the third base material 140, and the second metal layer 150 may be viewed as a composite PCB. The first metal layer 110 and the second metal layer 150 are, for example, copper foil layers; however, the disclosure is not limited thereto.

Figure 1B:
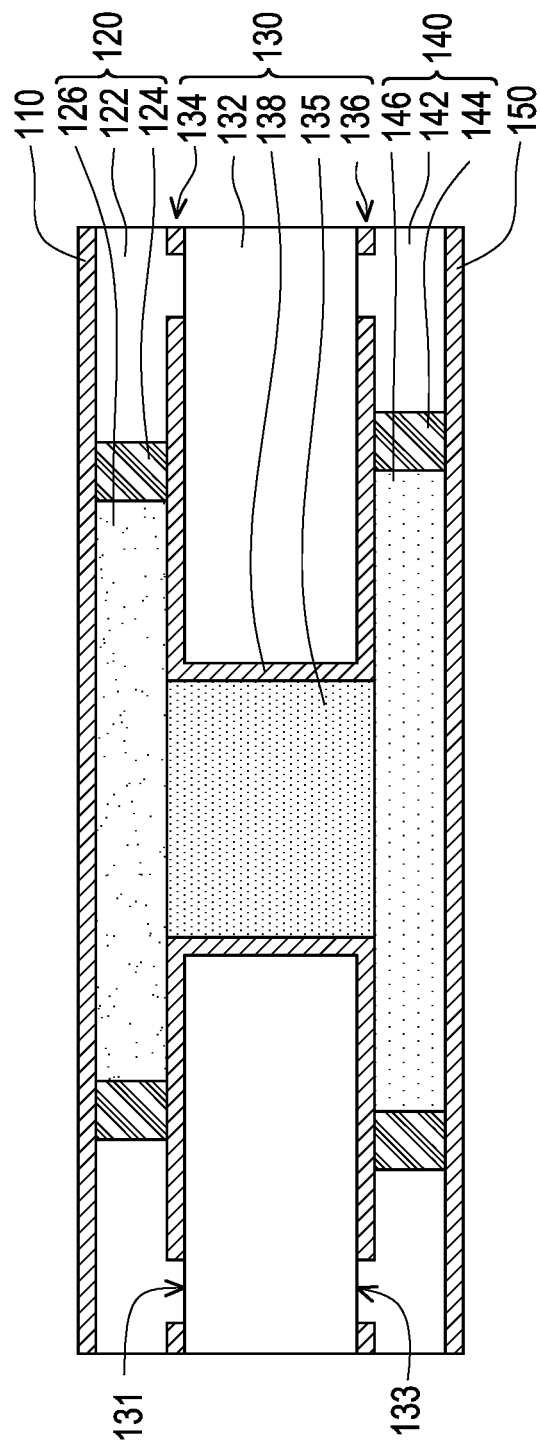

Next, referring to FIG. 1B, a thermal compressing process is performed to press-fit the first metal layer 110, the first base material 120, the second base material 130, the third base material 140, and the second metal layer 150. Since the thermal compressing manufacturing process is adopted, the first substrate 122 of the first base material 120 and the third substrate 142 of the third base material 140 may be converted from the initial B phase state into a C phase state, which is a state of being completely cured. Hence, the first metal layer 110, the second base material 130, and the second metal layer 150 are connected to the first base material 120 and the third base material 140. The second dielectric material 135 is located between the first dielectric material 126 and the third dielectric material 146. A dielectric constant of the first dielectric material 126 may be different from a dielectric constant of the second dielectric material 135 and a dielectric constant of the third dielectric material 146. The conductive structures (i.e. the first conductive pillars 124, the first circuit layer 134, the conductive connection layer 138, the second circuit layer 136, and the second conductive pillars 144) are electrically connected to each other and are connected to the first metal layer 110 and the second metal layer 150.

Specifically, in the embodiment, the first substrate 122 and the third substrate 142 may adopt a general dielectric material. A dielectric constant of the first substrate 122 and a dielectric constant of the third substrate 142 may be respectively greater than 3.6, and a dielectric dissipation factor (Df) of the first substrate 122 and a dielectric dissipation factor of the third substrate 142 may be respectively less than 0.02. Hence, proper impedance matching may be provided. Furthermore, the dielectric constant of the first dielectric material 126 and the dielectric constant of the third dielectric material 146 may be respectively less than 3.2, and a dielectric dissipation factor of the first dielectric material 126 and a dielectric dissipation factor of the third dielectric material 146 may be respectively greater than 0 and less than 0.006 so that a proper insulating property and proper impedance matching may be provided, and dielectric dissipation may be reduced. In addition, a dielectric constant of the second dielectric material 135 is less than 3.4, and a dielectric dissipation factor of the second dielectric material 135 is greater than 0 and less than 0.008 so that the proper insulating property and proper impedance matching may be provided, and the dielectric dissipation may be reduced. The process of press-fitting the first dielectric material 126, the second dielectric material 135, and the third dielectric material 146 is completed.

Figure 1C:
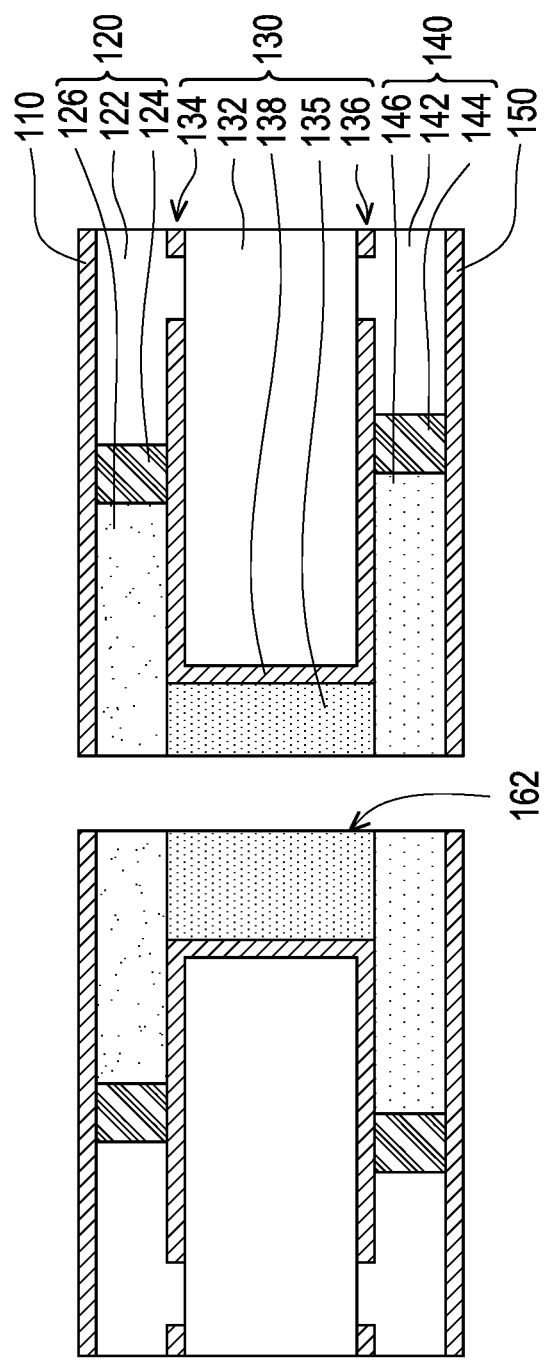
Figure 1D:
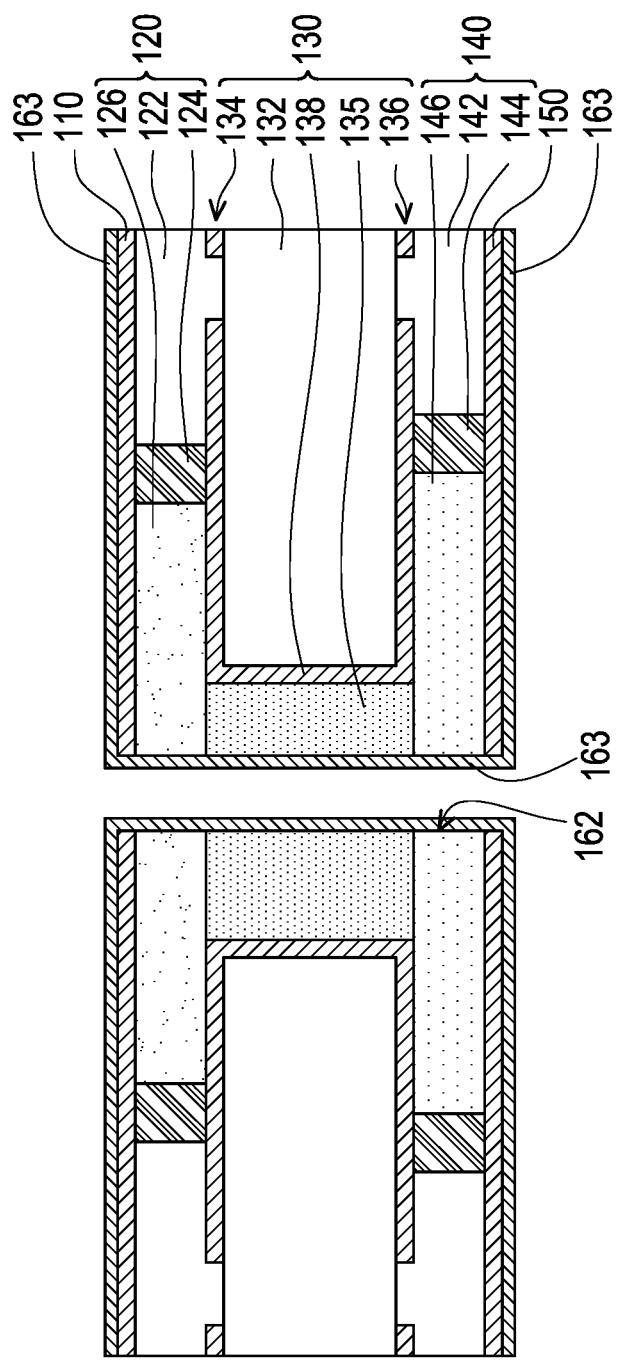

Next, referring to FIG. 1C, a via 162 is formed to penetrate the first dielectric material 126, the second dielectric material 135, and the third dielectric material 146. Referring to FIG. 1D, a conductive material layer 163 is formed to cover an inner wall of the via 162. The conductive material layer 163 further extends to cover on the first metal layer 110 and the second metal layer 150.

Figure 1E:
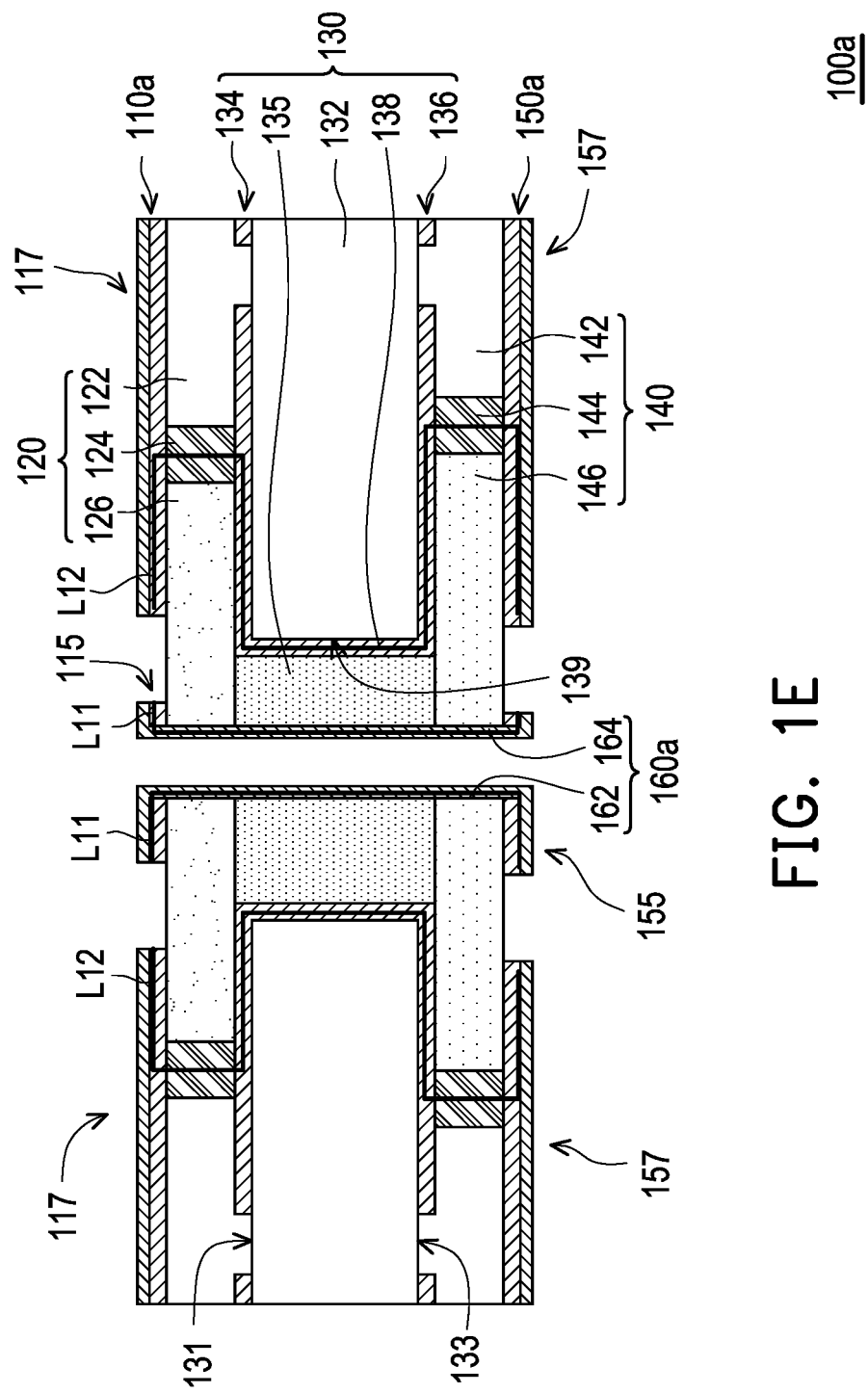
Figure 1F:
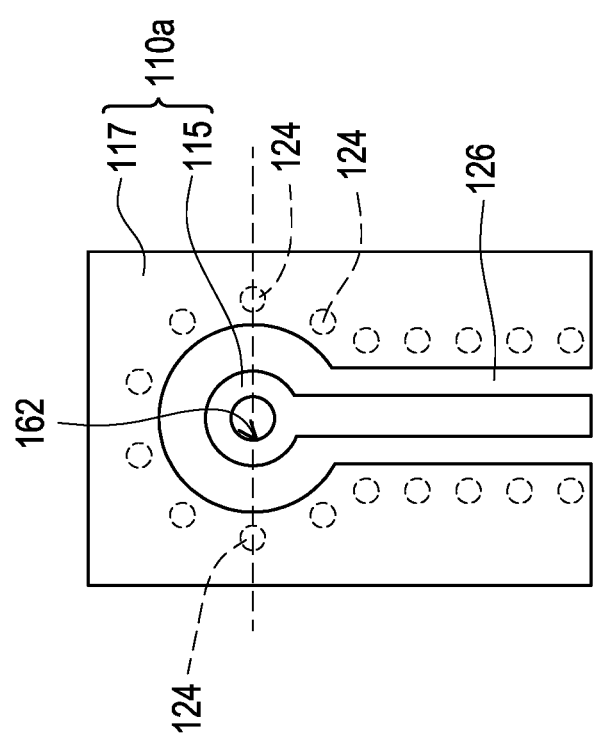
FIG. 1F is a top-view of the circuit board of FIG. 1E.

Next, referring to FIG. 1D and FIG. 1E together, the conductive material layer 163, the first metal layer 110, and the second metal layer 150 are patterned to form a first external circuit layer 110a on the first base material 120, a second external circuit layer 150a on the third base material 140, and a conductive via structure penetrating the first dielectric material 126, the second dielectric material 135, and the third dielectric material 146. The first external circuit layer 110a is formed on the first substrate 122, the first conductive pillars 124, and the first dielectric material 126 of the first base material 120 and is electrically connected to the first conductive pillars 124 and the conductive via structure 160a. The second external circuit layer 150a is formed on the third substrate 142, the second conductive pillars 144, and the third dielectric material 146 of the third base material 140 and is electrically connected to the second conductive pillars 144 and the conductive via structure 160a. Particularly, the first external circuit layer 110a, the second external circuit layer 150a, and the conductive via structure 160a are electrically connected to define a signal path L11. The conductive structures are electrically connected to the first external circuit layer 110a and the second external circuit layer 150a to define a ground path L12. The ground path L12 surrounds the signal path L11. The manufacture of a circuit board 100a is completed.

With respect to a structure, referring to FIG. 1E and FIG. 1F, the circuit board 100a of the embodiment includes the first dielectric material 126, the second dielectric material 135, the third dielectric material 146, the first external circuit layer 110a, the second external circuit layer 150a, the multiple conductive structures and the conductive via structure 160a. The second dielectric material 135 is located between the first dielectric material 126 and the third dielectric material 146, and the dielectric constant of the first dielectric material 126 is different from the dielectric constant of the second dielectric material 135 and the dielectric constant of the third dielectric material 146. The first external circuit layer 110a is disposed on the first dielectric material 126. The second external circuit layer 150a is disposed on the third dielectric material 146. The conductive via structure 160a penetrates the first dielectric material 126, the second dielectric material 135, and the third dielectric material 146 and is electrically connected to the first external circuit layer 110a and the second external circuit layer 150a to define the signal path L11. The conductive via structure 160a includes the via 162 and a conductive material layer 164. The via 162 penetrates the first dielectric material 126, the second dielectric material 135, and the third dielectric material 146. The conductive material layer 164 covers the inner wall of the via 162 and is electrically connected to the first external circuit layer 110a and the second external circuit layer 150a. The conductive structures include the first conductive pillars 124, the second conductive pillars 144, the first circuit layer 134, the second circuit layer 136, and the conductive connection layer 138, and the conductive structures are electrically connected to each other and surround the first dielectric material 126, the second dielectric material 135, and the third dielectric material 146. The conductive structures are electrically connected to the first external circuit layer 110a and the second external circuit layer 150a to define the ground path L12. The ground path L12 surrounds the signal path L11.

Specifically, the circuit board 100a of the embodiment further includes the first base material 120, the second base material 130, and the third base material 140. The first base material 120 includes the first substrate 122, the first dielectric material 126, and the first conductive pillars 124. The first dielectric material 126 and the first conductive pillars 124 penetrate the first substrate 122, and the first conductive pillars 124 are located between the first substrate 122 and the first dielectric material 126. The first conductive pillars 124 surround the first dielectric material 126. The second base material 130 includes the second substrate 132, the second dielectric material 135, the first circuit layer 134, the second circuit layer 136, and the conductive connection layer 138. The second substrate 132 has the first surface 131 and the second surface 133 opposite to each other and the opening 139, and the opening 139 penetrates the second substrate 132. The first circuit layer 134 and the second circuit layer 136 are respectively located on the first surface 131 and the second surface 133. The conductive connection layer 138 covers the inner wall of the opening 139 and is electrically connected to the first circuit layer 134 and the second circuit layer 136. The opening 139 is fully filled with the second dielectric material 135, and the conductive connection layer 138 surrounds the second dielectric material 135. The third base material 140 includes the third substrate 142, the third dielectric material 146, and the second conductive pillars 144. The third dielectric material 146 and the second conductive pillars 144 penetrate the third substrate 142, and the second conductive pillars 144 are located between the third substrate 142 and the third dielectric material 146. The second conductive pillars 144 surround the third dielectric material 146.

In addition, the first external circuit layer 110a of the embodiment includes a first signal circuit 115 and a first ground circuit 117. The second external circuit layer 150a includes a second signal circuit 155 and a second ground circuit 157. The first signal circuit 115, the conductive via structure 160a, and the second signal circuit 155 define the signal path L11. The first ground circuit 117, the first conductive pillars 124, the first circuit layer 134, the conductive connection layer 138, the second circuit layer 136, the second conductive pillars 144, and the second ground circuit 157 define the ground path L12. Since the signal path L11 is surrounded by the ground path L12 in a closed manner, a favorable high-frequency and high speed circuit may be formed. In addition, two sides of the signal path L11 and two sides of the ground path L12 are respectively on the same plane, and the circuit board 100a of the embodiment is provided with the first conductive pillars 124 and the second conductive pillars 144 to fill a notch of a shield and form a complete shield. As a result, signal energy loss and noise interference may be effectively reduced, and reliability of the signal transmission may be increased.

In summary, in the embodiment, the signal path L11 defined by the first signal circuit 115, the conductive via structure 160a, and the second signal circuit 155 is surrounded by the ground path L12 defined by the first ground circuit 117, the first conductive pillars 124, the first circuit layer 134, the conductive connection layer 138, the second circuit layer 136, the second conductive pillars 144, and the second ground circuit 157. That is, the ground path L12 with favorable closure is provided around the signal path L11 capable of transmitting a high-frequency and high speed signal such as a 5G signal so that the favorable high-frequency and high speed circuit may be formed and the circuit board 100a of the embodiment may exhibit favorable signal integrity. Here, high-frequency refers to a frequency greater than 1 GHz, and high speed refers to a data transmission speed greater than 100 Mbps. In addition, data transmission speed and quality are important to a high-frequency circuit, and the main factors affecting the data transmission speed and quality are electrical properties of a transmission material, that is, a dielectric constant (Dk) and a dielectric dissipation factor (Df) of the material. By reducing a dielectric constant and a dielectric dissipation factor of a base material, signal propagation delay time may be effectively reduced. Moreover, signal transmission speed may be increased, and signal transmission loss may be reduced.

In the embodiment, since the relatively costly first dielectric material 126, second dielectric material 135, and third dielectric material 146 are only disposed around the via 162, compared to adopting the same material on the entire base material, a consumption amount of the dielectric material may be effectively reduced so that a cost may be effectively reduced. Moreover, the signal transmission speed may be increased, and the signal transmission loss may be reduced. In addition, the first base material 120, the second base material 130, and the third base material 140 provided in the embodiment are circuit board final products, and the first metal layer 110 and the second metal layer 150 are semi-final products. The first metal layer 110, the first base material 120, the second base material 130, and the third base material 140, and the second metal layer 150 are integrated by press-fitting. The conductive via structure 160a, the conductive connection layer 138 and the second dielectric material 135 of the second base material 130 define a coaxial via. The second dielectric material 135 is located between the conductive via structure 160a and the conductive connection layer 138. Compared to the conventional technology in which an inner conductor layer and an outer conductor layer of a coaxial via are blocked through a build-up process of press-fitting an insulating layer, the manufacturing method of the circuit board 100a of the embodiment may prevent high-frequency signal integrity from being affected by impedance mismatch. In addition, since a number of circuit board layers is not increased by adopting the build-up process of press-fitting the insulating layer, adjacent structure layers are not connected by adopting a design of stacked vias of conductive vias. Therefore, the manufacturing method of the circuit board 100a of the embodiment may overcome energy loss of the conductive via, and the method may further prevent unfavorable reliability of thermal stress of stacked vias.

It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 2A:
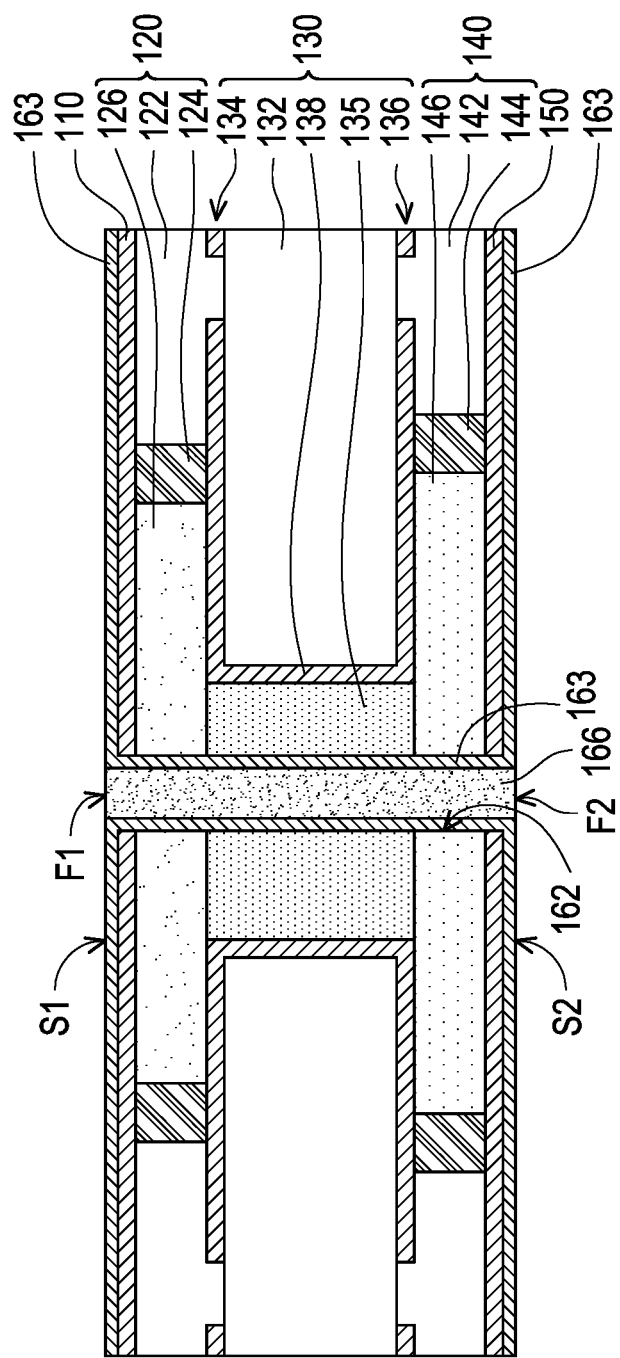
FIG. 2A to FIG. 2B are schematic cross-sectional diagrams of some steps of another manufacturing method of a circuit board according to another embodiment of the disclosure.
Figure 2B:
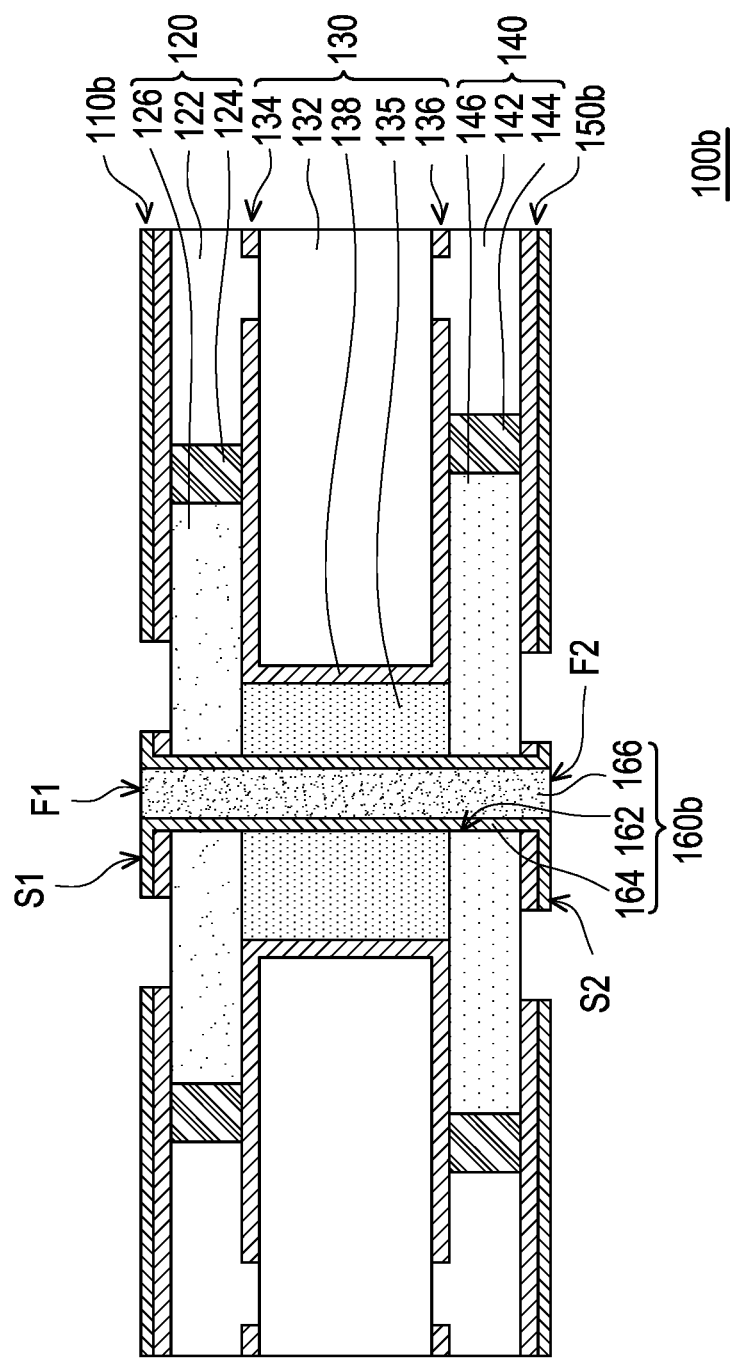

FIG. 2A to FIG. 2B are schematic cross-sectional diagrams of some steps of another manufacturing method of a circuit board according to another embodiment of the disclosure. Referring to FIG. 1D and FIG. 2A together, the manufacturing method of the circuit board in the embodiment is similar to the manufacturing method of the circuit board above, and the difference lies in the following. After forming the conductive material layer 163 as shown in FIG. 1D, referring to FIG. 2A, a plugging process is performed to fill a dielectric layer 166 in the via 162. The via 162 is fully filled with the dielectric layer 166. An upper surface F1 and a lower surface F2 of the dielectric layer 166 that are opposite to each other may be respectively flush with a top surface S1 and a bottom surface S2 of the conductive material layer 163. If the dielectric layer 166 is higher than the top surface S1 and the bottom surface S2 of the conductive material layer 163, a polishing method may be alternatively adopted so that the upper surface F1 and a lower surface F2 of the dielectric layer 166 are respectively flush with the top surface S1 and the bottom surface S2 of the conductive material layer 163 to maintain favorable flatness. A material of the dielectric layer 166 may be resin and viewed as a plugging agent or a dielectric material with a dielectric constant greater than 3.6 and a dielectric dissipation factor less than 0.05.

Next, referring to FIG. 2A and FIG. 2B together, a lithography process is performed to pattern the conductive material layer 163, the first metal layer 110, and the second metal layer 150 to form a first external circuit layer 110b and a second external circuit layer 150b. The first external circuit layer 110b is located on the first substrate 122 of the first base material 120 and has the top surface S1. The second external circuit layer 150b is located on the third substrate 142 of the third base material 140 and has the bottom surface S2. The upper surface F1 and the lower surface F2 of the dielectric layer 166 that are opposite to each other are respectively flush with the top surface S1 of the first external circuit layer 110b and the bottom surface S2 of the second external circuit layer 150b. A conductive via structure 160b includes the via 162, the conductive material layer 164, and the dielectric layer 166 located in the via 162. The manufacture of a circuit board 100b is completed.

Figure 3A:
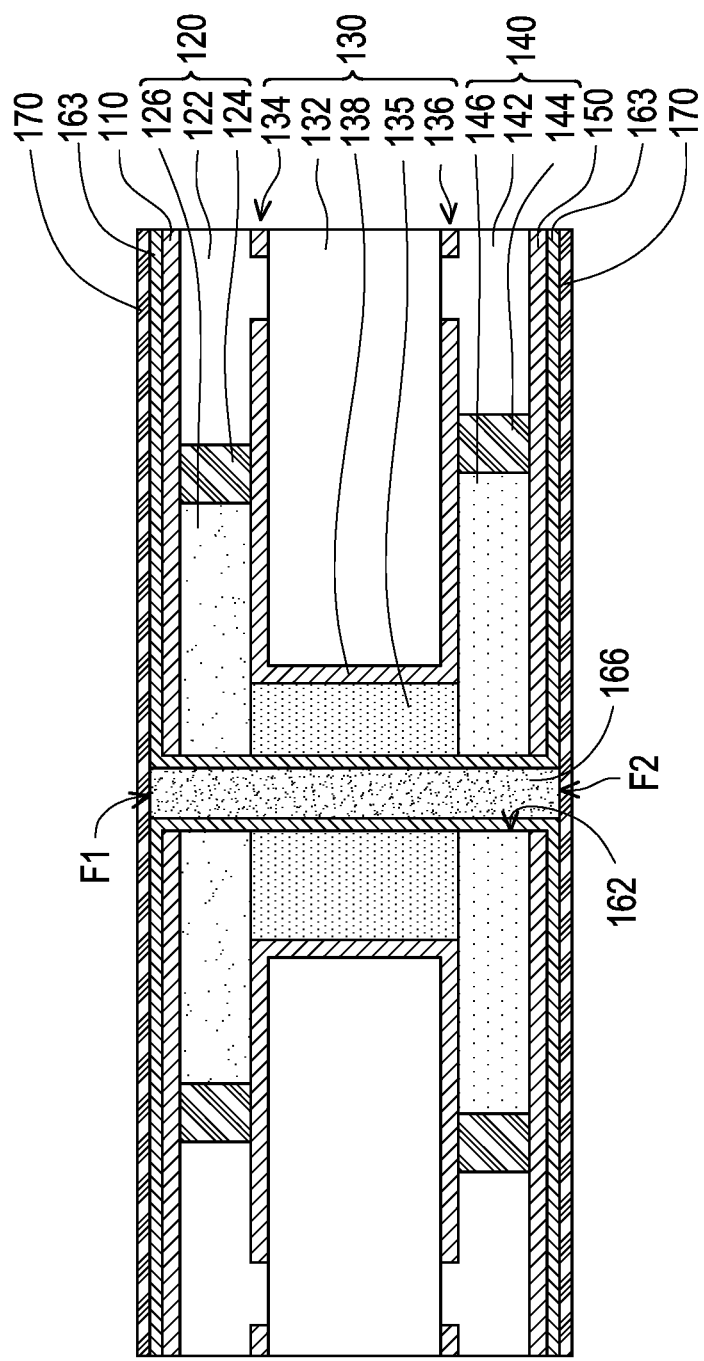
FIG. 3A to FIG. 3B are schematic cross-sectional diagrams of some steps of another manufacturing method of a circuit board according to another embodiment of the disclosure.
Figure 3B:
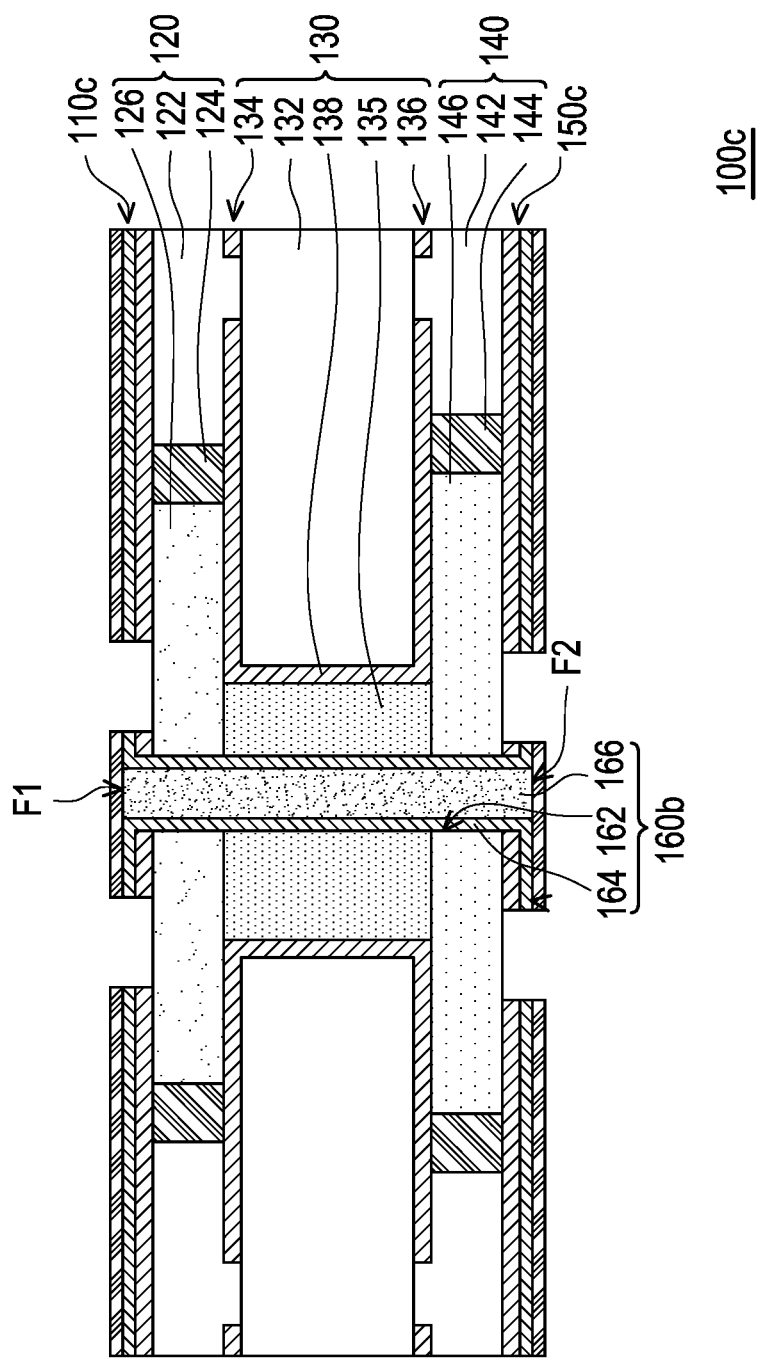

FIG. 3A to FIG. 3B are schematic cross-sectional diagrams of some steps of another manufacturing method of a circuit board according to another embodiment of the disclosure. Referring to FIG. 2A and FIG. 3A together, the manufacturing method of the circuit board in the embodiment is similar to the manufacturing method of the circuit board above, and the difference lies in the following. After filling the dielectric layer 166 in the via 162 as shown in FIG. 2A, referring to FIG. 3A, a capping layer 170 is formed on the conductive material layer 163. The capping layer 170 covers the conductive material layer 163 and the upper surface F1 and the lower surface F2 of the dielectric layer 166. A material of the capping layer 170 is, for example, copper; however, the disclosure is not limited thereto. Next, referring to FIG. 3A and FIG. 3B together, the lithography process is performed to pattern the capping layer 170, the conductive material layer 163, the first metal layer 110, and the second metal layer 150 to form a first external circuit layer 110c and a second external circuit layer 150c. The first external circuit layer 110c and the second external circuit layer 150c respectively cover the upper surface F1 and the lower surface F2 of the dielectric layer 166 that are opposite to each other. The manufacture of a circuit board 100c is completed.

Figure 4A:
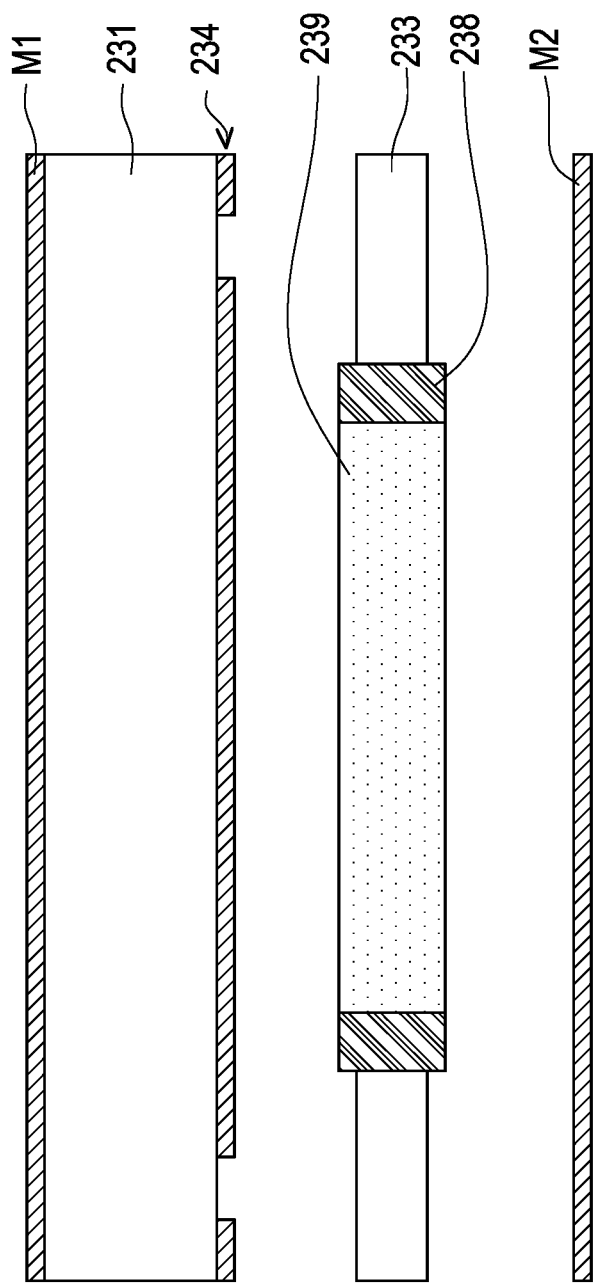
FIG. 4A to FIG. 4K are schematic cross-sectional diagrams of another manufacturing method of a circuit board according to another embodiment of the disclosure.
Figure 4B:
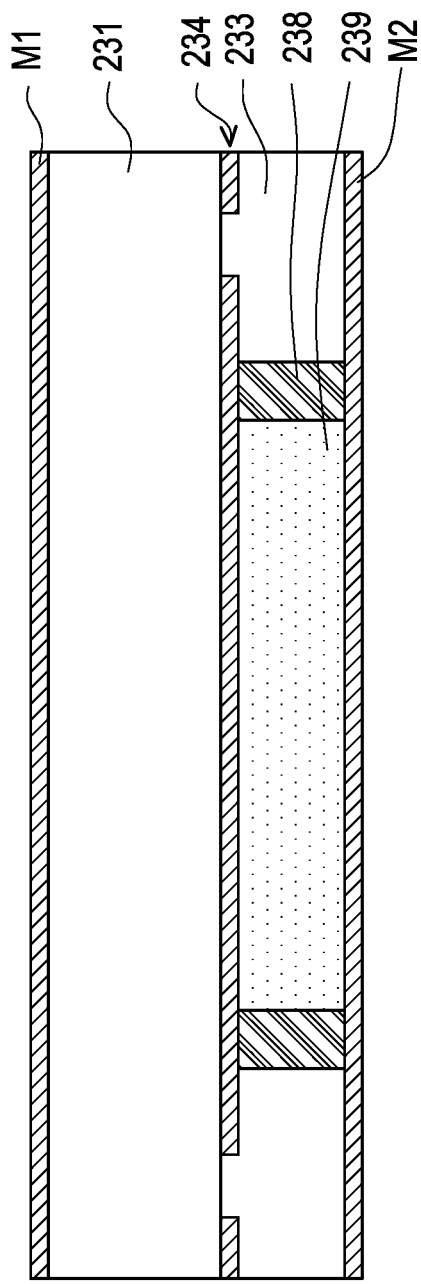
Figure 4C:
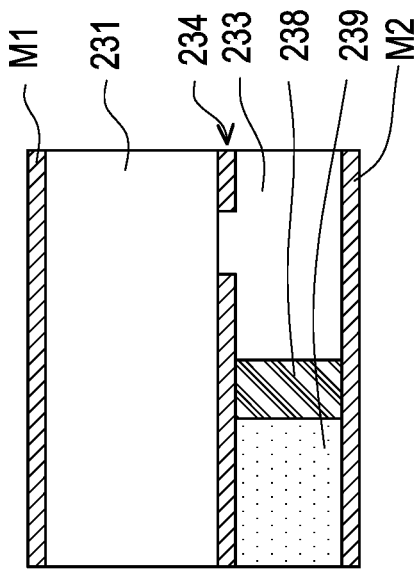
Figure 4C:
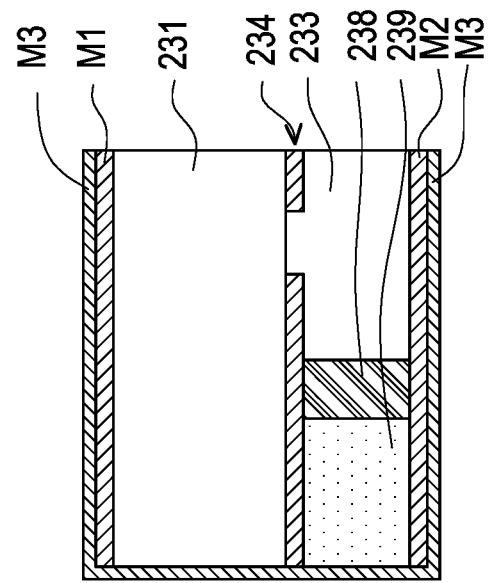
Figure 4D:
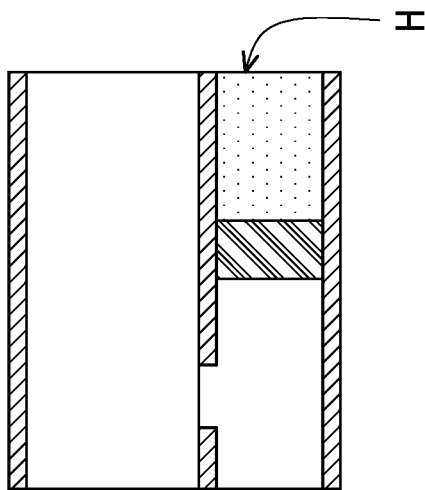
Figure 4D:
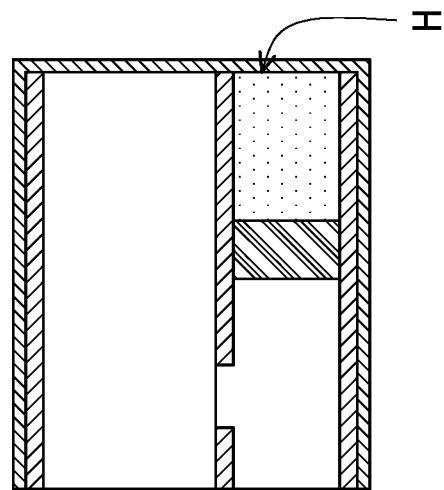
Figure 4E:
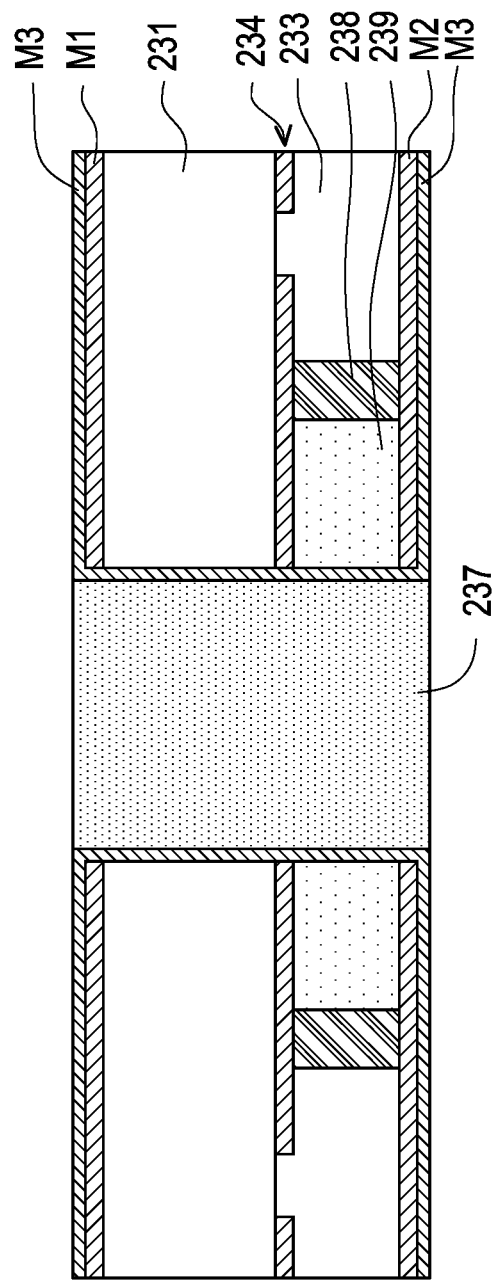
Figure 4F:
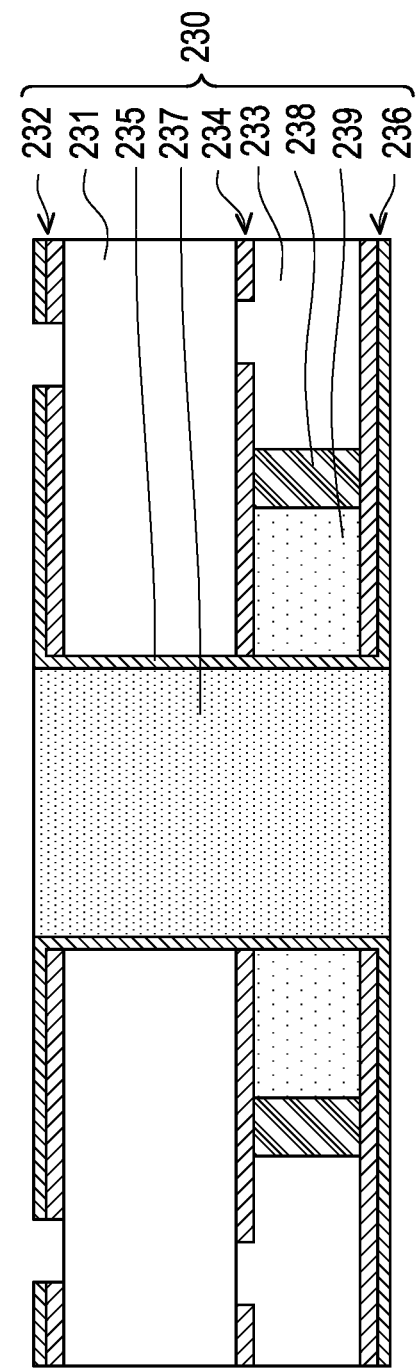
Figure 4G:
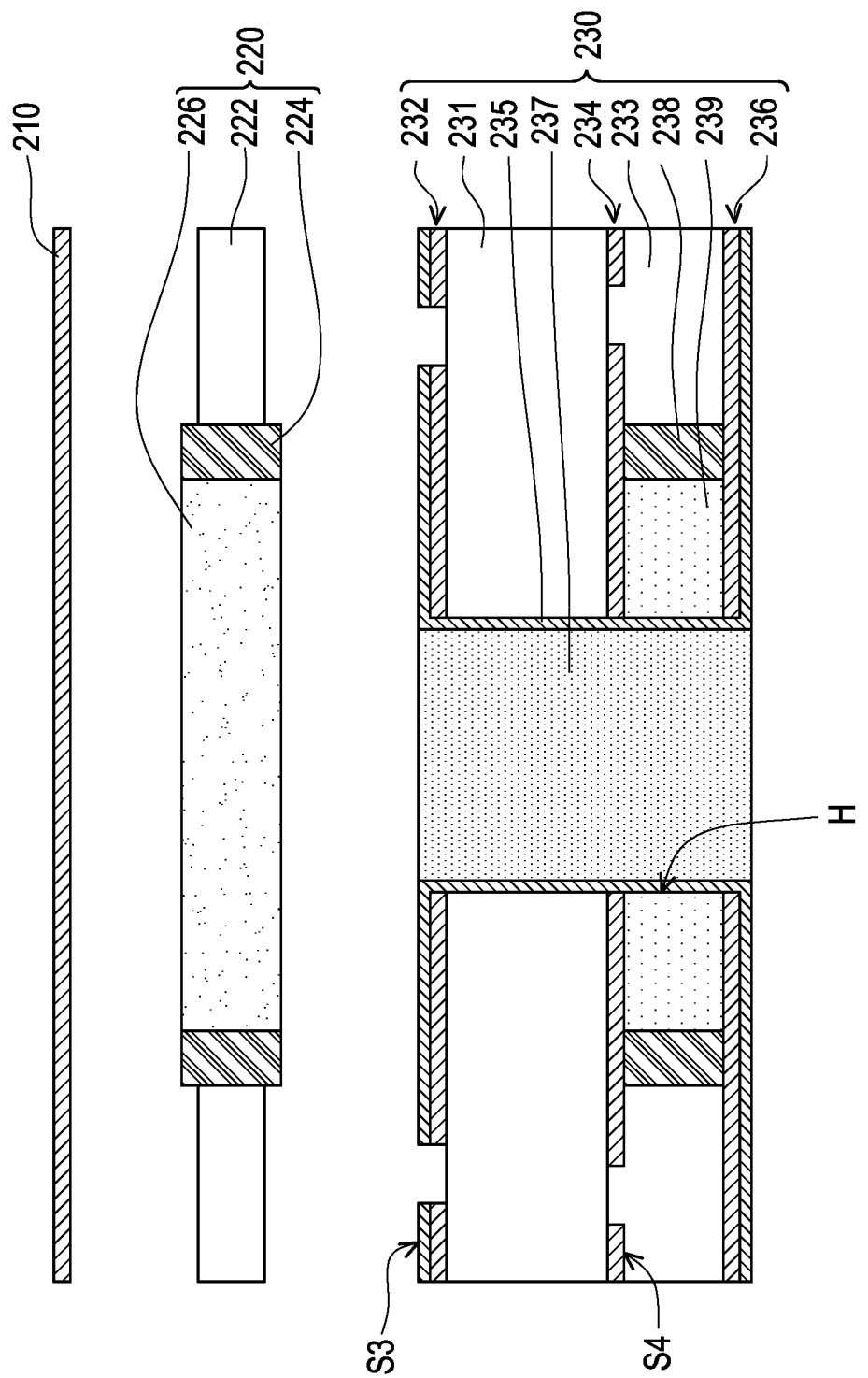

FIG. 4A to FIG. 4K are schematic cross-sectional diagrams of another manufacturing method of a circuit board according to another embodiment of the disclosure. Referring to FIG. 1A and FIG. 4G together first, the manufacturing method of the circuit board in the embodiment is similar to the manufacturing method of the circuit board above, and the difference lies in the following. In the embodiment, the third base material 140 is omitted, and a second base material 230 is different from the second base material 130.

Specifically, referring to FIG. 4A first, a second substrate 231, a metal layer M1, a second circuit layer 234, a third substrate 233, second conductive pillars 238, a third dielectric material 239, and a metal layer M2 are provided. The metal layer M1 and the second circuit layer 234 are respectively located at two opposite sides of the second substrate 231. The metal layer M1 is, for example, a copper foil layer, and the second circuit layer 234 is exposed out of a partial surface of the second substrate 231. The third dielectric material 239 penetrates the third substrate 233, and the second conductive pillars 238 penetrate the third dielectric material 239. Two surfaces of the second conductive pillars 238 and third dielectric material 239 opposite to each other respectively protrude out of two opposite surfaces of the third substrate 233. The third substrate 233 is located between the second substrate 231 and the metal layer M2. The third substrate 233 is currently in the B phase state. That is, the third substrate 233 is not completely cured. The manufacturing method of the third substrate 233, the second conductive pillars 238, and the third dielectric material 239 and the forming method of the third base material 140 shown in FIG. 1A are the same, and relevant details are not repeated.

Next, referring to FIG. 4B, the thermal compressing process is performed to press-fit the second substrate 231, the third substrate 233, and the metal layer M2. Since the thermal compressing manufacturing process is adopted, the third substrate 233 may be converted from the initial B phase state into the C phase state, which is the state of being completely cured. Hence, the second substrate 231, the second circuit layer 234, and the metal layer M2 are connected to the third substrate 233. The second circuit layer 234 is electrically connected to the metal layer M2 through the second conductive pillars 238.

Next, referring to FIG. 4C, an opening H is formed to penetrate the metal layer M1, the second substrate 231, the second circuit layer 234, the third substrate 233, the third dielectric material 239, and the metal layer M2. Next, referring to FIG. 4D, a metal layer M3 is formed to cover an inner wall of the opening H and the metal layer M1 and the metal layer M2. Next, referring to FIG. 4E, a second dielectric material 237 is filled in the opening H. Two opposite surfaces of the second dielectric material 237 are respectively flush with the metal layer M3. Next, referring to FIG. 4E and FIG. 4F together, through the lithography process, the metal layer M1, the metal layer M2, and the metal layer M3 are patterned to form a first circuit layer 232 located on the second substrate 231, a third circuit layer 236 located on the third substrate 233, and a conductive connection layer 235 connected to the first circuit layer 232 and the third circuit layer 236. The manufacture of the second base material 230 is completed.

Next, referring to FIG. 4G, a metal layer 210, a first base material 220, and the second base material 230 are provided. The metal layer 210 is, for example, a copper foil layer; however, the disclosure is not limited thereto. The first base material 220 includes a first substrate 222, a first dielectric material 226, and first conductive pillars 224. The first dielectric material 226 and the first conductive pillars 224 penetrate the first substrate 222, and the first conductive pillars 224 are located between the first substrate 222 and the first dielectric material 226. The first conductive pillars 224 surround the first dielectric material 226. The forming method of the first base material 220 and the forming method of the first base material 120 shown in FIG. 1A are the same, and it is not repeated. The second base material 230 includes the second substrate 231, the third substrate 233, the second dielectric material 237, the third dielectric material 239, the first circuit layer 232, the second circuit layer 234, the third circuit layer 236, the conductive connection layer 235, the second conductive pillars 238, and the opening H. The second substrate 231 has a first surface S3 and a second surface S4 opposite to each other. The first circuit layer 232 and the second circuit layer 234 are respectively located on the first surface S3 and the second surface S4. The second circuit layer 234 is located between the first circuit layer 232 and the third circuit layer 236. The third substrate 233 and the third dielectric material 239 are located on the second surface S4 of the second substrate 231, and the third circuit layer 236 is located on the third substrate 233 and the third dielectric material 239. The second conductive pillars 238 are electrically connected to the second circuit layer 234 and the third circuit layer 236. The second conductive pillars 238 surround the third dielectric material 239. The opening H penetrates the second substrate 231 and the third dielectric material 239. The conductive connection layer 235 covers the inner wall of the opening H and is electrically connected to the first circuit layer 232, the second circuit layer 234, and the third circuit layer 236. The opening H is fully filled with the second dielectric material 237, and the conductive connection layer 235 surrounds the second dielectric material 237. Note that the first conductive pillars 224, the second conductive pillars 238, the first circuit layer 232, the second circuit layer 234, the third circuit layer 236, and the conductive connection layer 235 may be viewed as multiple conductive structures, and the multiple conductive structures surrounding the first dielectric material 226, the second dielectric material 237, and the third dielectric material 239 are formed here. The metal layer 210, the first base material 220, and the second base material 230 may be viewed as a composite PCB.

Figure 4H:
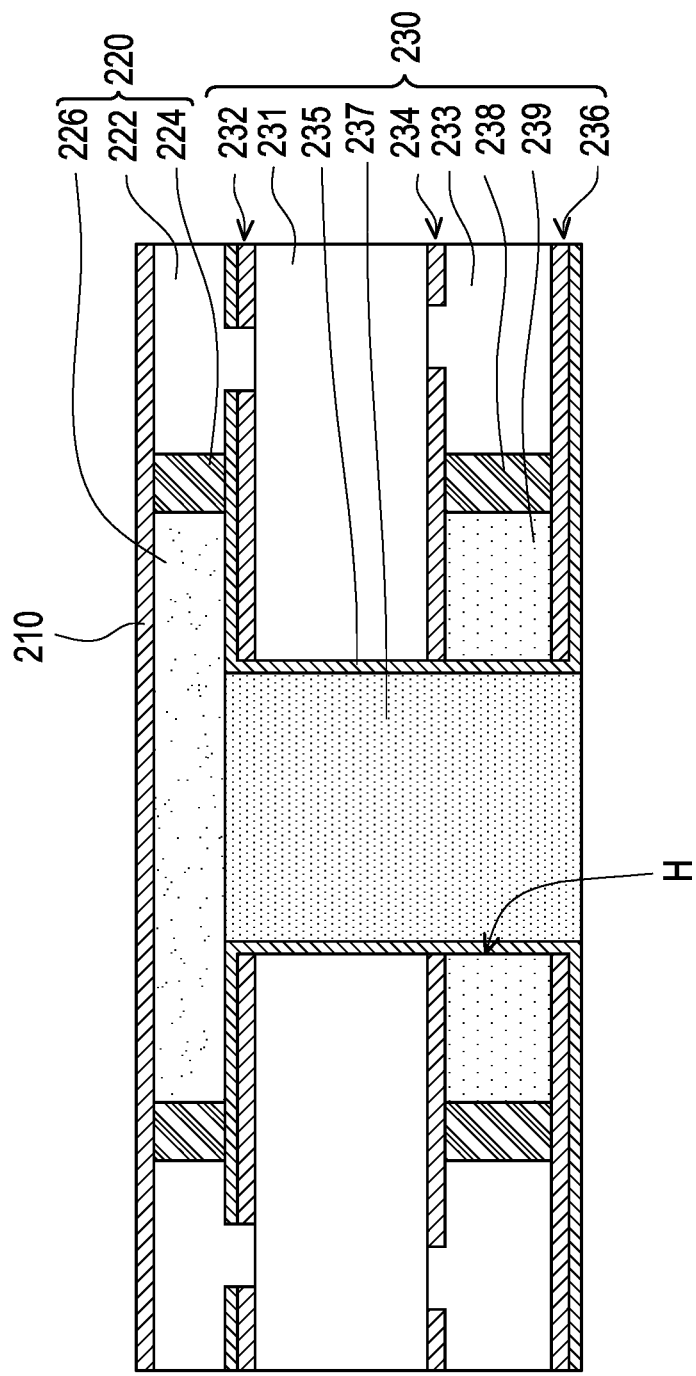

Next, referring to FIG. 4H, the thermal compressing process is performed to press-fit the metal layer 210, the first base material 220, and the second base material 230. Since the thermal compressing manufacturing process is adopted, the first substrate 222 of the first base material 220 may be converted from the initial B phase state into the C phase state, which is the state of being completely cured. Hence, the metal layer 210 and the second base material 230 are connected to the first base material 220.

Figure 4I:
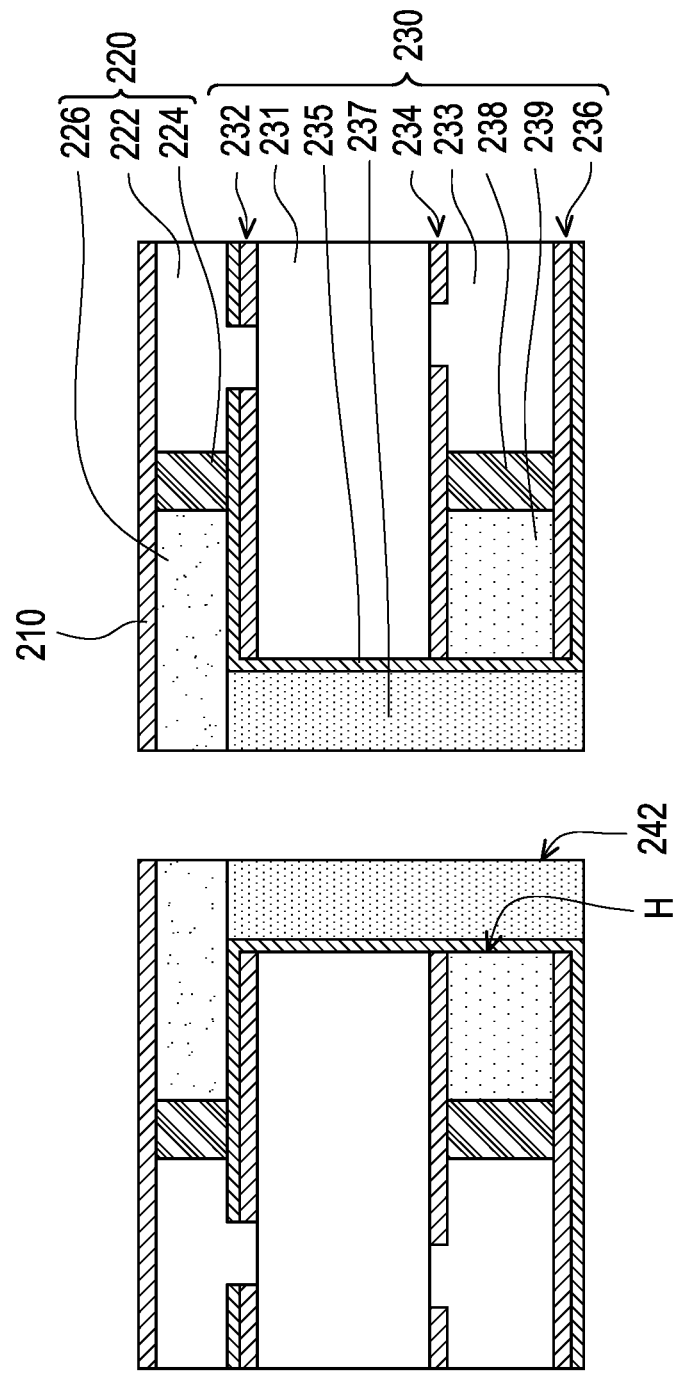
Figure 4J:
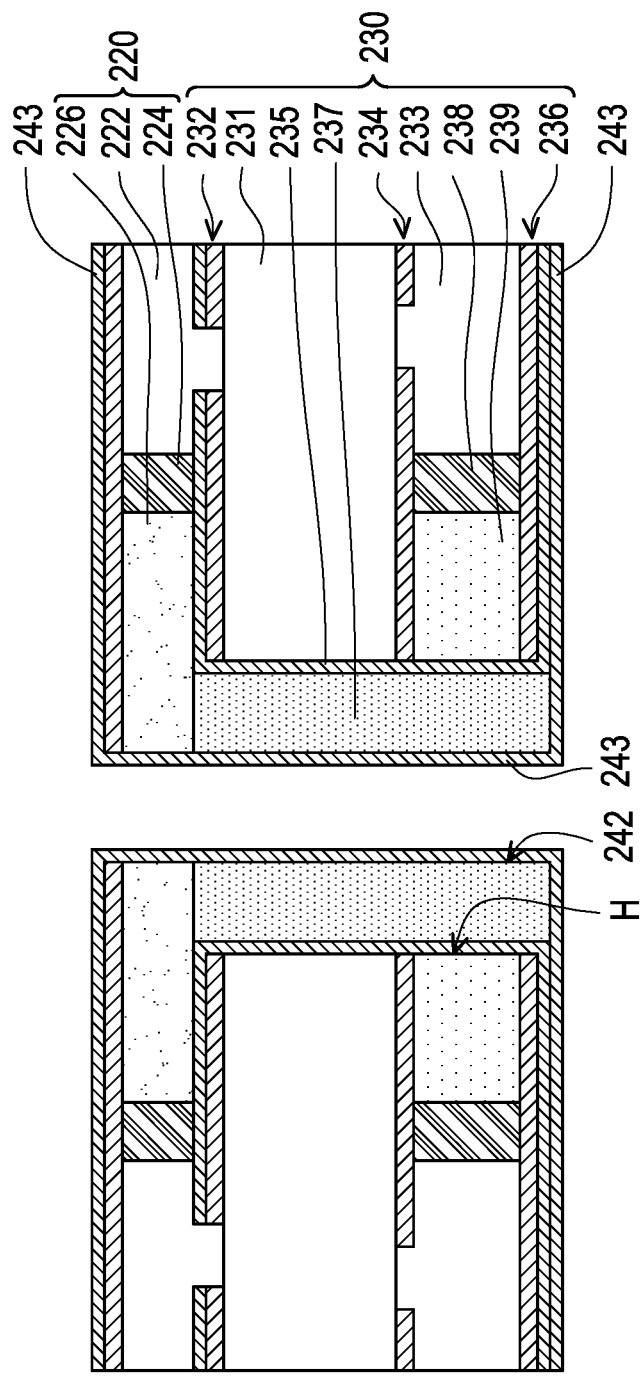

Next, referring to FIG. 4I, a via 242 is formed to penetrate the metal layer 210, the first dielectric material 226, and the second dielectric material 237. Referring to FIG. 4J, a conductive material layer 243 is formed to cover an inner wall of the via 242. The conductive material layer 243 further extends to cover on the metal layer 210 and the third circuit layer 236.

Figure 4K:
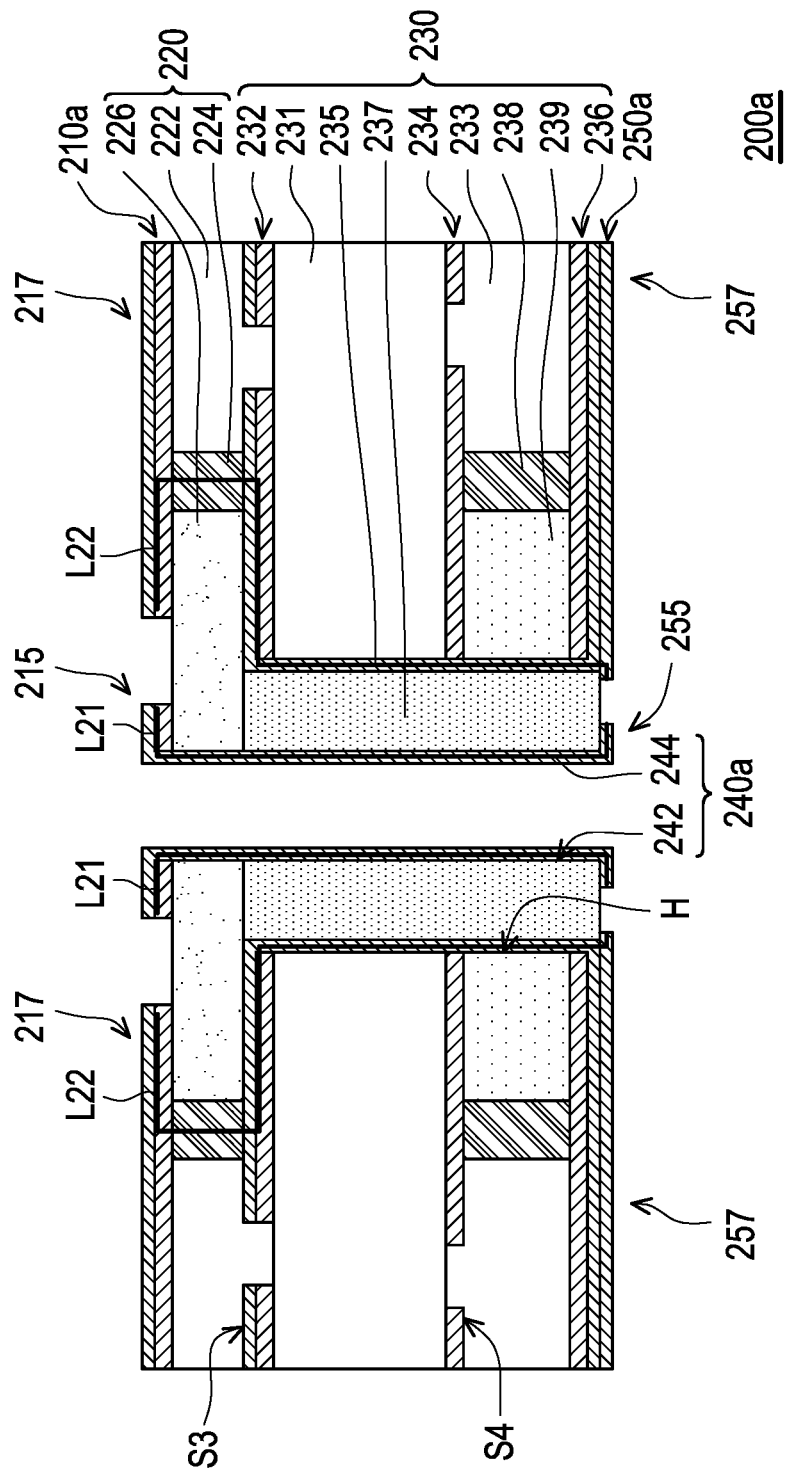

Next, referring to FIG. 4J and FIG. 4K together, the conductive material layer 243, the metal layer 210 are patterned to form a first external circuit layer 210a on the first base material 220, a second external circuit layer 250a on the second base material 230, and a conductive via structure 240a penetrating the first dielectric material 226 and the second dielectric material 237. The first external circuit layer 210a is formed on the first substrate 222, the first conductive pillars 224, and the first dielectric material 226 of the first base material 220 and is electrically connected to the first conductive pillars 224 and the conductive via structure 240a. The second external circuit layer 250a is formed on the third circuit layer 236 of the second base material 230 and is electrically connected to the third circuit layer 236 and the conductive via structure 240a. Particularly, the first external circuit layer 210a includes a first signal circuit 215 and a first ground circuit 217. The second external circuit layer 250a includes a second signal circuit 255 and a second ground circuit 257. The first signal circuit 215, the conductive via structure 240a, and the second signal circuit 255 define a signal path L21. The first ground circuit 217, the first conductive pillars 224, the first circuit layer 232, the conductive connection layer 235, and the second ground circuit 257 define a ground path L22. The ground path L22 surrounds the signal path L21. The manufacture of a circuit board 200a is completed.

With respect to a structure, referring to FIG. 1E and FIG. 4K together, the circuit board 200a of the embodiment is similar to the circuit board 100a above, and the difference lies in the following. In the embodiment, the circuit board 200a does not include the third base material 140, and the via 242 of the conductive via structure 240a penetrates the first dielectric material 226 of the first base material 220 and the second dielectric material 237 of the second base material 230. A conductive material layer 244 of the conductive via structure 240a covers the inner wall of the via 242 and is electrically connected to the first external circuit layer 210a and the second external circuit layer 250a. Specifically, the circuit board 200a includes the first external circuit layer 210a, the first base material 220, the second base material 230, the conductive via structure 240a, and the second external circuit layer 250a. The first base material 220 includes the first substrate 222, the first dielectric material 226, and the first conductive pillars 224. The first dielectric material 226 and the first conductive pillars 224 penetrate the first substrate 222, and the first conductive pillars 224 are located between the first substrate 222 and the first dielectric material 226. The first conductive pillars 224 surround the first dielectric material 226. The second base material 230 includes the second substrate 231, the third substrate 233, the second dielectric material 237, the third dielectric material 239, the first circuit layer 232, the second circuit layer 234, the third circuit layer 236, the conductive connection layer 235, the second conductive pillars 238, and the opening H. The second substrate 231 has the first surface S3 and the second surface S4 opposite to each other. The first circuit layer 232 and the second circuit layer 234 are respectively located on the first surface S3 and the second surface S4. The third substrate 233 and the third dielectric material 239 are located at the second surface S4 of the second substrate 231. The third circuit layer 236 is located on the third substrate 233 and the third dielectric material 239. The second circuit layer 234 is located between the first circuit layer 232 and the third circuit layer 236. The second conductive pillars 238 are electrically connected to the second circuit layer 234 and the third circuit layer 236. The second conductive pillars 238 surround the third dielectric material 239. The opening H penetrates the second substrate 231 and the third dielectric material 239. The conductive connection layer 235 covers the inner wall of the opening H and is electrically connected to the first circuit layer 232, the second circuit layer 234, and the third circuit layer 236. The opening H is fully filled with the second dielectric material 237, and the conductive connection layer 235 surrounds the second dielectric material 237. Here, the conductive structures include the first conductive pillars 224, the second conductive pillars 238, the first circuit layer 232, the second circuit layer 234, the third circuit layer 236, and the conductive connection layer 235.

In summary, in the embodiment, the signal path L21 defined by the first signal circuit 215, the conductive via structure 240a, and the second signal circuit 255 is surrounded by the ground path L22 defined by the first ground circuit 217, the first conductive pillars 224, the first circuit layer 232, the conductive connection layer 235, and the second ground circuit 257. That is, the ground path L22 with favorable closure is provided around the signal path L21 capable of transmitting the high-frequency and high speed signal such as the 5G signal so that the favorable high-frequency and high speed circuit may be formed and the circuit board 200a of the embodiment may exhibit favorable signal integrity. In addition, the conductive via structure 240a, the conductive connection layer 235 and the second dielectric material 237 of the second base material 230 define a coaxial via. The second dielectric material 237 is located between the conductive via structure 240a and the conductive connection layer 235. Compared to the conventional technology in which an inner conductor layer and an outer conductor layer of a coaxial via are blocked through a build-up process of press-fitting an insulating layer, the manufacturing method of the circuit board 200a of the embodiment may prevent high-frequency signal integrity from being affected by impedance mismatch.

Figure 5A:
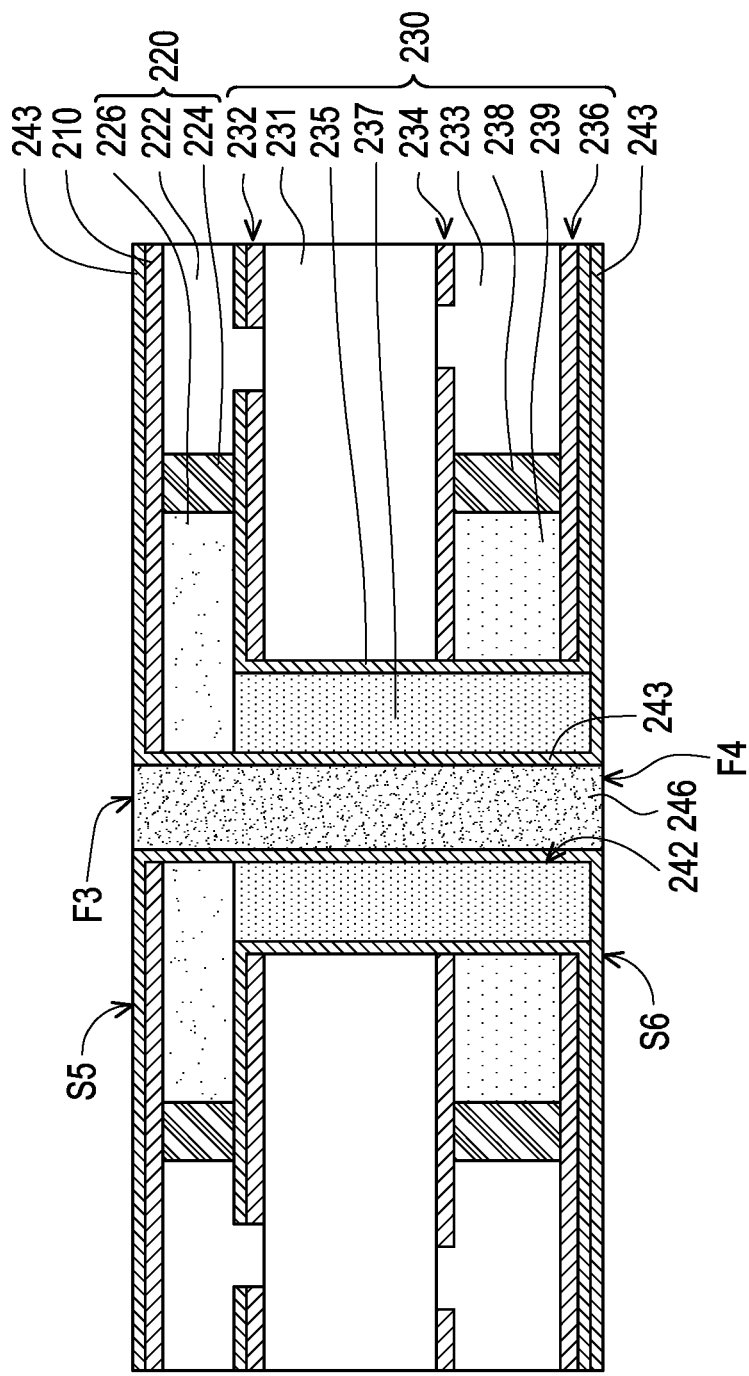
FIG. 5A to FIG. 5B are schematic cross-sectional diagrams of some steps of another manufacturing method of a circuit board according to another embodiment of the disclosure.
Figure 5B:
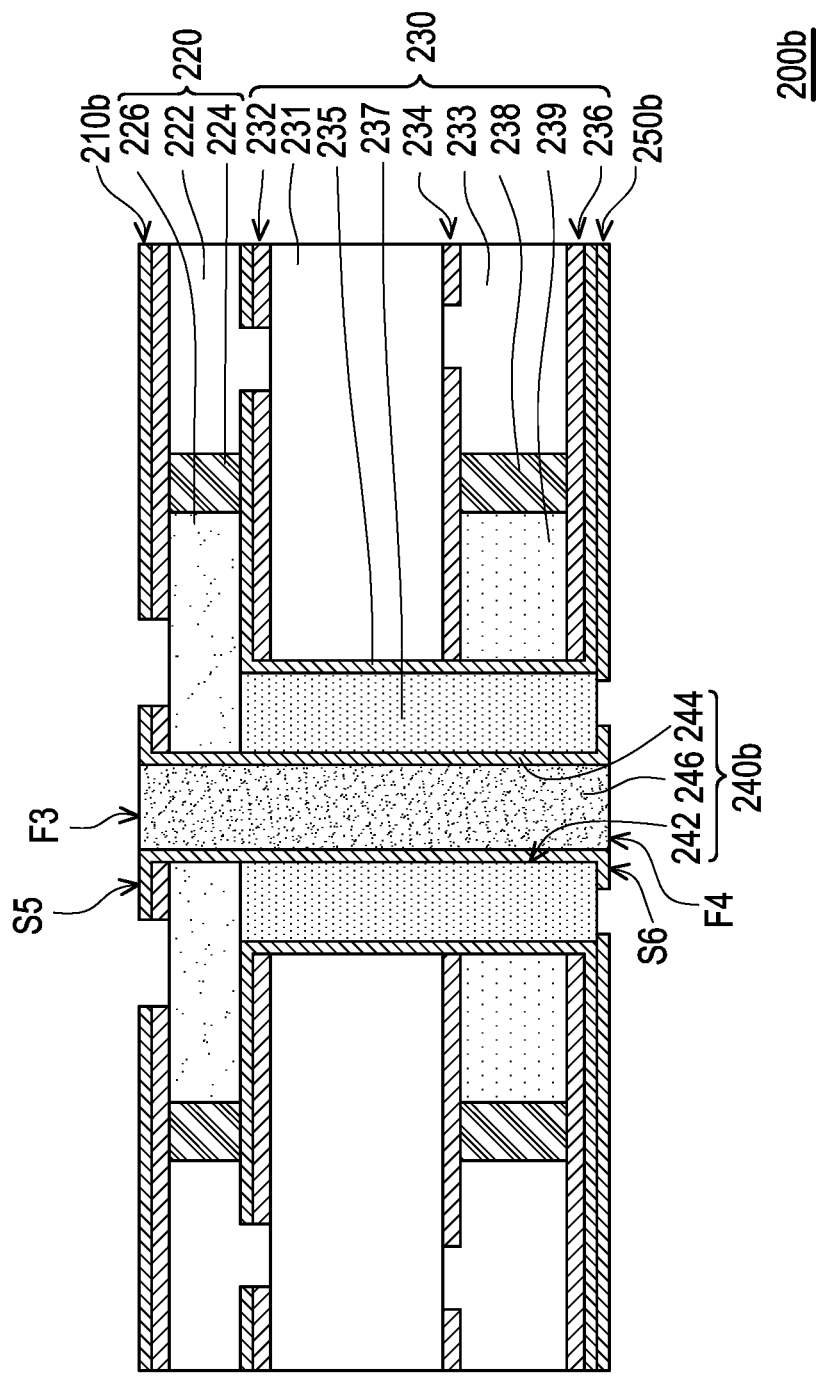

FIG. 5A to FIG. 5B are schematic cross-sectional diagrams of some steps of another manufacturing method of a circuit board according to another embodiment of the disclosure. Referring to FIG. 4J and FIG. 5A together, the manufacturing method of the circuit board in the embodiment is similar to the manufacturing method of the circuit board above, and the difference lies in the following. After forming the conductive material layer 243 as shown in FIG. 4J, referring to FIG. 5A, the plugging process is performed to fill a dielectric layer 246 in the via 242. The via 242 is fully filled with the dielectric layer 246. An upper surface F3 and a lower surface F4 of the dielectric layer 246 that are opposite to each other may be respectively flush with a top surface S5 and a bottom surface S6 of the conductive material layer 243. If the dielectric layer 246 is higher than the top surface S5 and the bottom surface S6 of the conductive material layer 243, the polishing method may be alternatively adopted so that the upper surface F3 and the lower surface F4 of the dielectric layer 246 are respectively flush with the top surface S5 and the bottom surface S6 of the conductive material layer 243. A material of the dielectric layer 246 may be resin and viewed as a plugging agent or a dielectric material with a dielectric constant greater than 3.6 and a dielectric dissipation factor less than 0.05.

Next, referring to FIG. 5A and FIG. 5B together, the lithography process is performed to pattern the conductive material layer 243 and the metal layer 210 to form a first external circuit layer 210b and a second external circuit layer 250b. The first external circuit layer 210b is located on the first substrate 222 of the first base material 220 and has the top surface S5. The second external circuit layer 250b is located on the third substrate 236 of the second base material 230 and has the bottom surface S6. The upper surface F3 and the lower surface F4 of the dielectric layer 246 that are opposite to each other are respectively flush with the top surface S5 of the first external circuit layer 210b and the bottom surface S6 of the second external circuit layer 250b. A conductive via structure 240b includes the via 242, the conductive material layer 244, and the dielectric layer 246 located in the via 242. The manufacture of a circuit board 200b is completed.

Figure 6A:
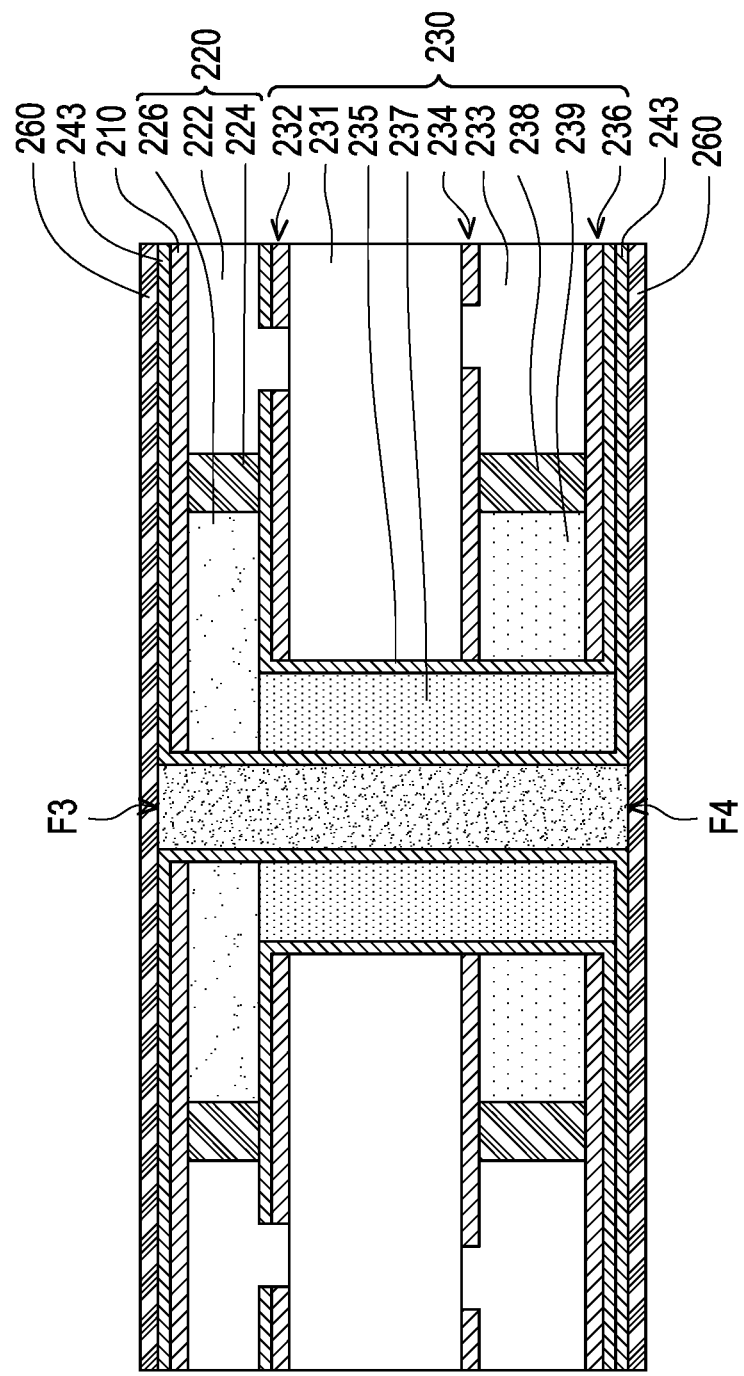
FIG. 6A to FIG. 6B are schematic cross-sectional diagrams of some steps of another manufacturing method of a circuit board according to another embodiment of the disclosure.
Figure 6B:
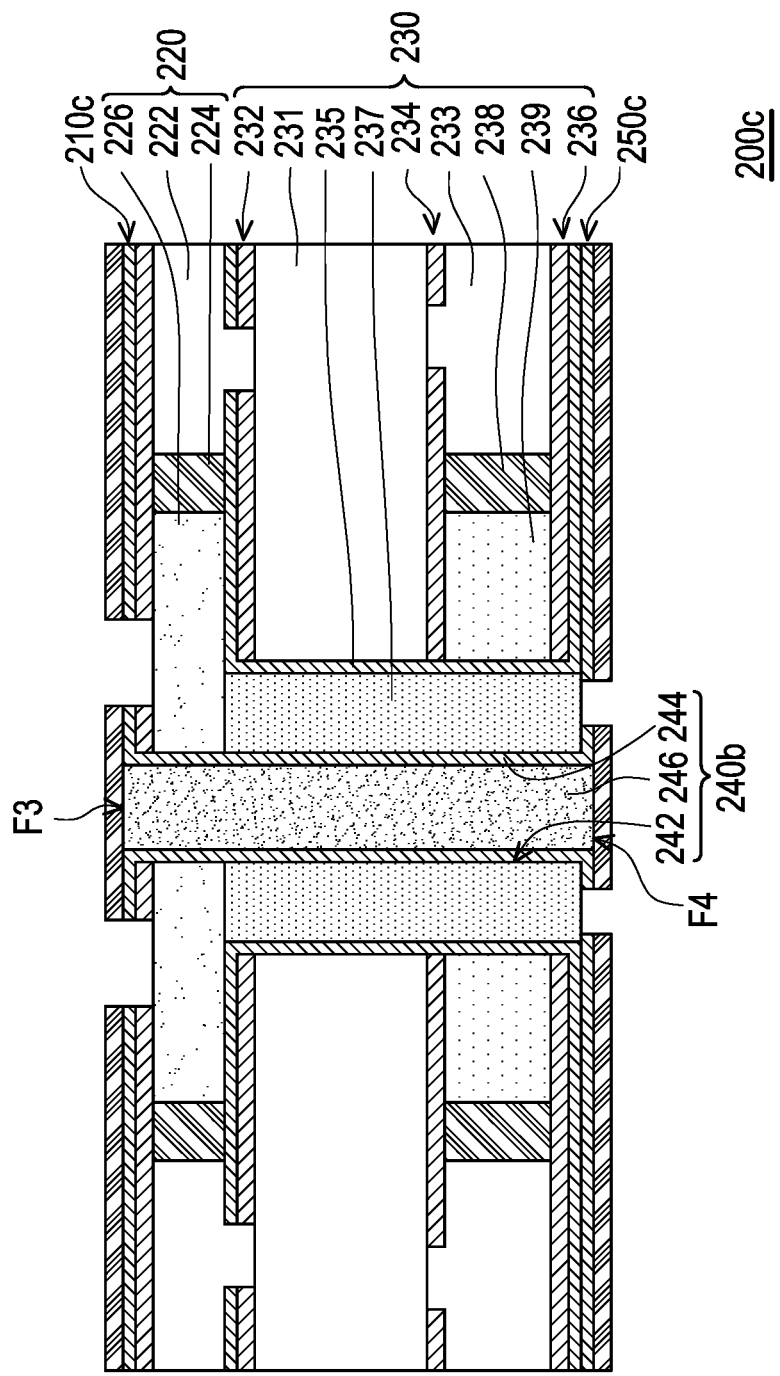

FIG. 6A to FIG. 6B are schematic cross-sectional diagrams of some steps of another manufacturing method of a circuit board according to another embodiment of the disclosure. Referring to FIG. 5A and FIG. 6A together, the manufacturing method of the circuit board in the embodiment is similar to the manufacturing method of the circuit board above, and the difference lies in the following. After filling the dielectric layer 246 in the via 242 as shown in FIG. 5A, referring to FIG. 6A, a capping layer 260 is formed on the conductive material layer 243. The capping layer 260 covers the conductive material layer 243 and the upper surface F3 and the lower surface F4 of the dielectric layer 246. A material of the capping layer 260 is, for example, copper; however, the disclosure is not limited thereto. Next, referring to FIG. 6A and FIG. 6B together, the lithography process is performed to pattern the capping layer 260, the conductive material layer 243, the metal layer 210 to form a first external circuit layer 210c and a second external circuit layer 250c. The first external circuit layer 210c and the second external circuit layer 250c respectively cover the upper surface F3 and the lower surface F24 of the dielectric layer 246 that are opposite to each other. The manufacture of a circuit board 200c is completed.

Figure 7A:
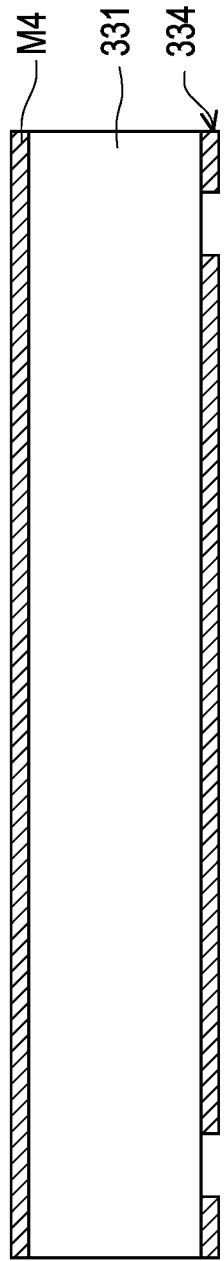
Figure 7A:
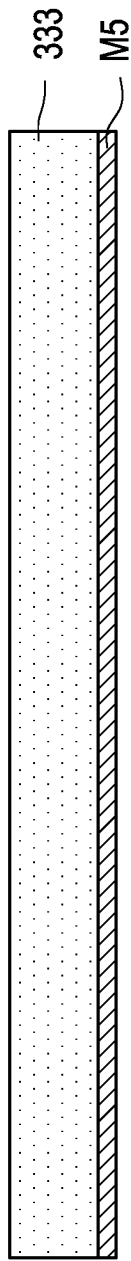
Figure 7B:
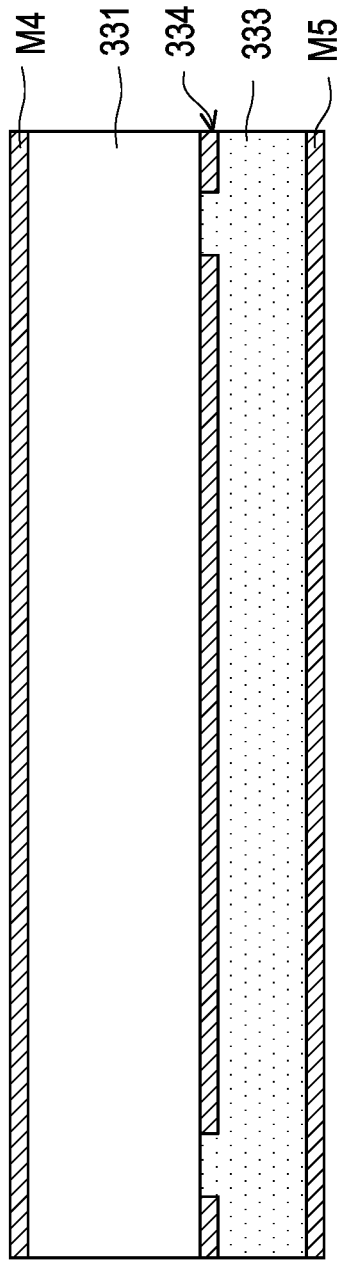
Figure 7E:
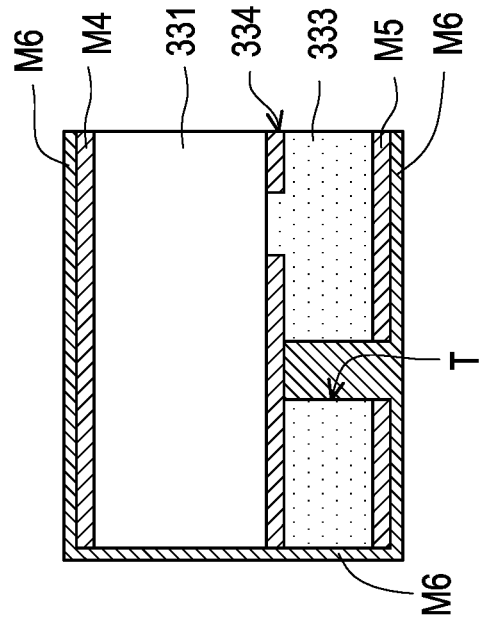
Figure 7F:
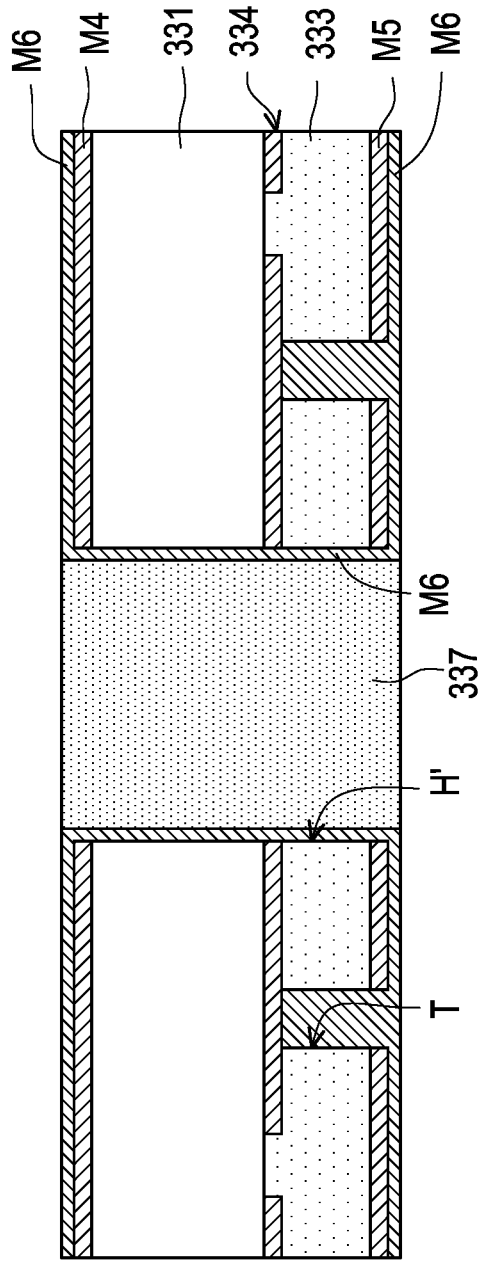
Figure 7G:
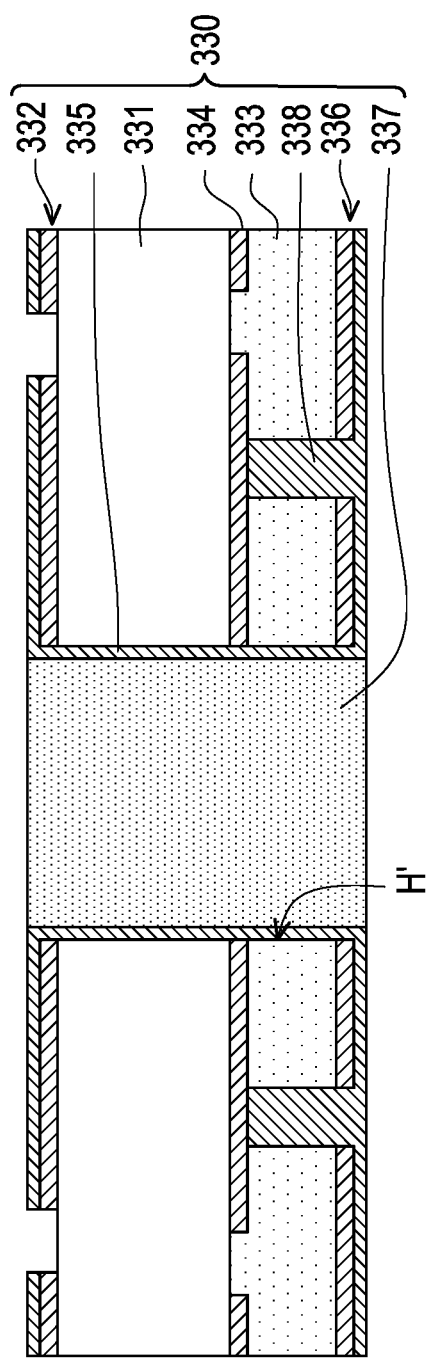
Figure 7H:
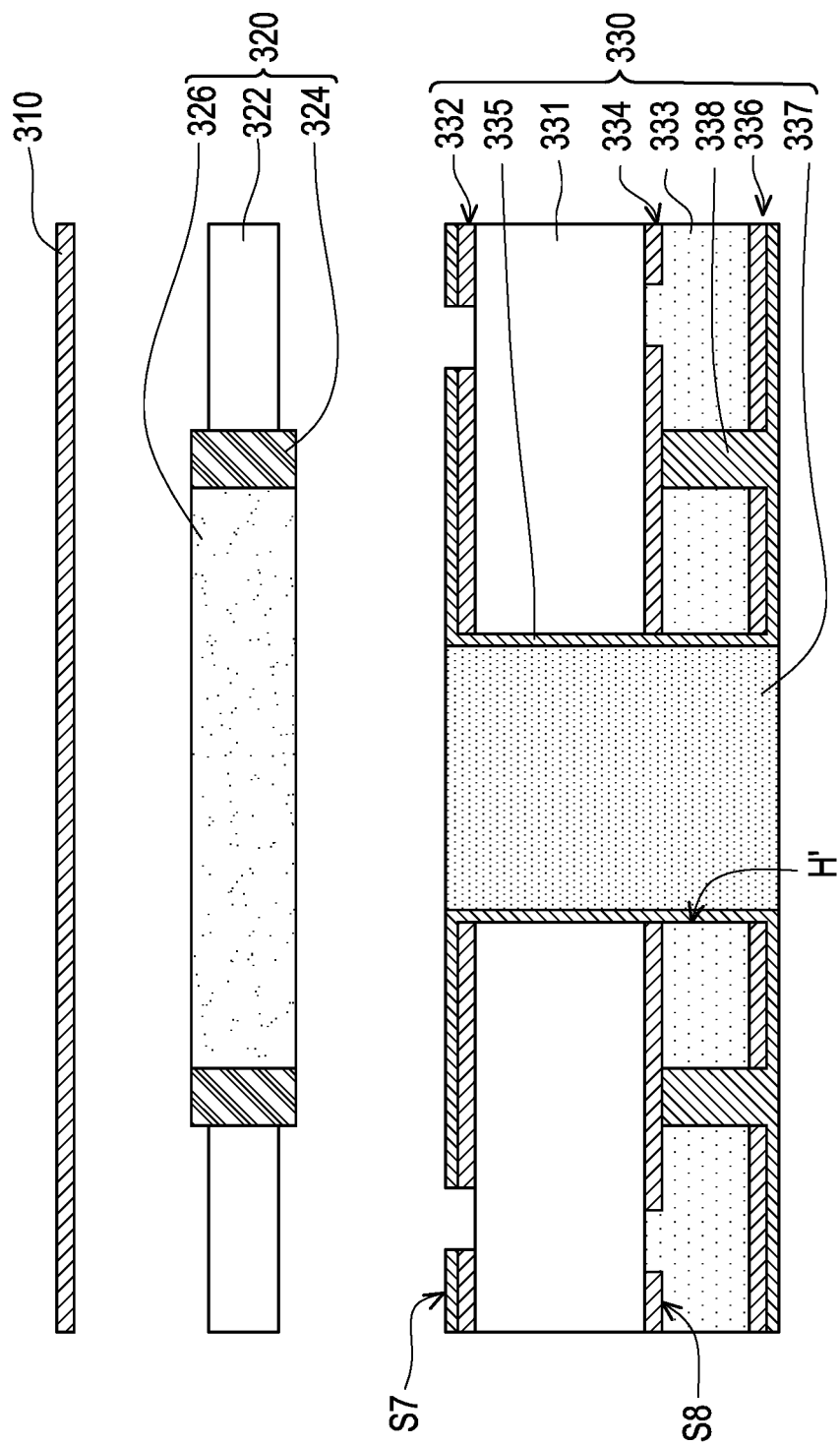

FIG. 7A to FIG. 7L are schematic cross-sectional diagrams of another manufacturing method of a circuit board according to another embodiment of the disclosure. Referring to FIG. 1A and FIG. 7H together first, the manufacturing method of the circuit board in the embodiment is similar to the manufacturing method of the circuit board above, and the difference lies in the following. In the embodiment, the third base material 140 is omitted, and a second base material 330 is different from the second base material 130.

Specifically, referring to FIG. 7A first, a second substrate 331, a metal layer M4, a second circuit layer 334, a third dielectric material 333, and a metal layer M5 are provided. The metal layer M4 and the second circuit layer 334 are respectively located at two opposite sides of the second substrate 331. The second circuit layer 334 is exposed out of a partial surface of the second substrate 331. The metal layer M5 is disposed on the third dielectric material 333 and fully covers a side surface of the third dielectric material 333. The third dielectric material 333 is located between the second substrate 331 and the metal layer M5. The third dielectric material 333 is currently in the B phase state. That is, the third substrate 233 is not completely cured. Next, referring to FIG. 7B, the thermal compressing process is performed to press-fit the second substrate 331 and the third dielectric material 333. Since the thermal compressing manufacturing process is adopted, the third dielectric material 333 may be converted from the initial B phase state into the C phase state, which is the state of being completely cured. Hence, the second substrate 331, the second circuit layer 334, and the metal layer M5 are connected to the third dielectric material 333.

Next, referring to FIG. 7C, an opening H' is formed to penetrate the metal layer M4, the second substrate 331, the second circuit layer 334, the third dielectric material 333, and the metal layer M5. Next, referring to FIG. 7D, a via T is formed to penetrate the metal layer M5 and the third dielectric material 333 so that a part of the second circuit layer 334 is exposed. Next referring to FIG. 7E, a metal layer M6 is formed to cover an inner wall of the opening H' and the metal layer M4 and the metal layer M5, and the via T is fully filled with the metal layer M6. Next, referring to FIG. 7F, a second dielectric material 337 is filled in the opening H'. Two opposite surfaces of the second dielectric material 337 are respectively flush with the metal layer M6. Next, referring to FIG. 7F and FIG. 7G together, through the lithography process, the metal layer M4, the metal layer M5, and the metal layer M6 are patterned to form a first circuit layer 332 located on the second substrate 331, a third circuit layer 336 located on the third substrate 333, a conductive connection layer 335 connected to the first circuit layer 332 and the third circuit layer 336, and a via 338 connected to the second circuit layer 334 and the third circuit layer 336. The manufacture of the second base material 330 is completed.

Next, referring to FIG. 7H, a metal layer 310, a first base material 320, and the second base material 330 are provided. The first base material 320 includes a first substrate 322, a first dielectric material 326, and first conductive pillars 324. The first dielectric material 326 and the first conductive pillars 324 penetrate the first substrate 322, and the first conductive pillars 324 are located between the first substrate 322 and the first dielectric material 326. The first conductive pillars 324 surround the first dielectric material 326. The forming method of the first base material 320 and the forming method of the first base material 120 shown in FIG. 1A are the same, and it is not repeated. The second base material 330 includes the second substrate 331, the second dielectric material 337, the third dielectric material 333, the first circuit layer 332, the second circuit layer 334, the third circuit layer 336, the conductive connection layer 335, the via 338, and the opening H'. The second substrate 331 has a first surface S7 and a second surface S8 opposite to each other. The first circuit layer 332 and the second circuit layer 334 are respectively located on the first surface S7 and the second surface S8. The second circuit layer 334 is located between the first circuit layer 332 and the third circuit layer 336. The third dielectric material 333 is located on the second surface S8 of the second substrate 331, and the third circuit layer 336 is located on the third dielectric material 333. The via 138 penetrates the third dielectric material 333 and is electrically connected to the first circuit layer 334 and the third circuit layer 336. The opening H' penetrates the second substrate 331 and the third dielectric material 333. The conductive connection layer 335 covers the inner wall of the opening H' and is electrically connected to the first circuit layer 332, the second circuit layer 334, and the third circuit layer 336. The opening H' is fully filled with the second dielectric material 337, and the conductive connection layer 335 surrounds the second dielectric material 337. Note that the first conductive pillars 324, the via 338, the first circuit layer 332, the second circuit layer 334, the third circuit layer 336, and the conductive connection layer 335 may be viewed as multiple conductive structures, and the multiple conductive structures surrounding the first dielectric material 326, the second dielectric material 337, and the third dielectric material 333 are formed here. The metal layer 310, the first base material 320, and the second base material 330 may be provided and be viewed as a composite PCB.

Figure 7I:
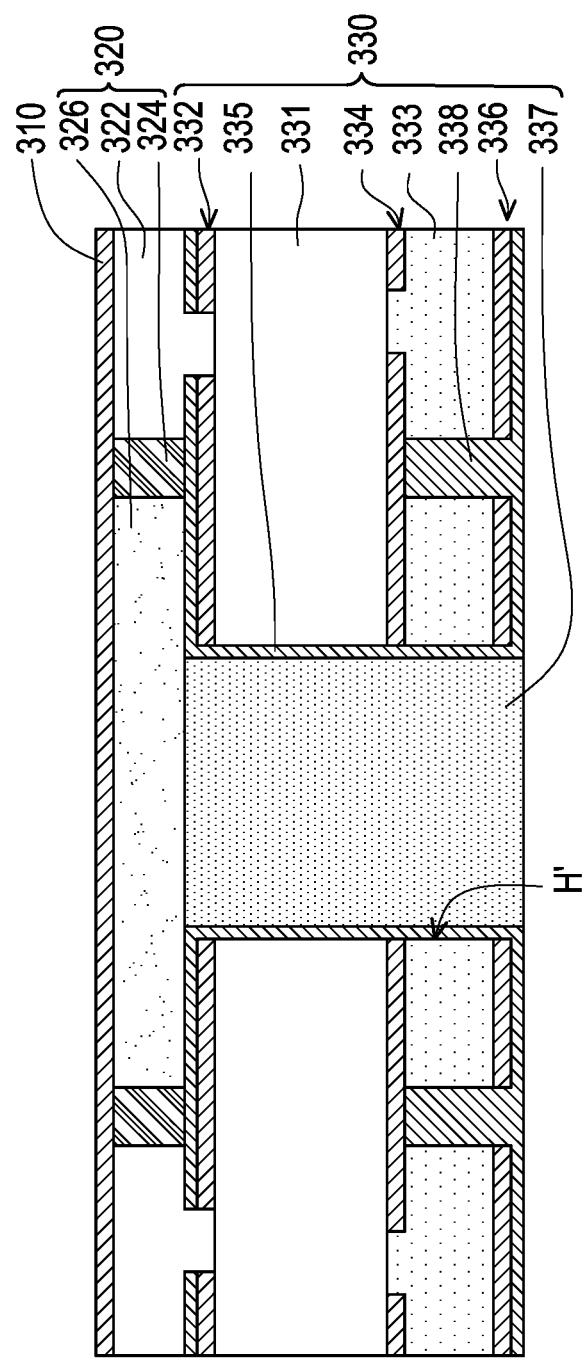

Next, referring to FIG. 7I, the thermal compressing process is performed to press-fit the metal layer 310, the first base material 320, and the second base material 330. Since the thermal compressing manufacturing process is adopted, the first substrate 322 of the first base material 320 may be converted from the initial B phase state into the C phase state, which is the state of being completely cured. Hence, the metal layer 310 and the second base material 330 are connected to the first base material 320.

Figure 7J:
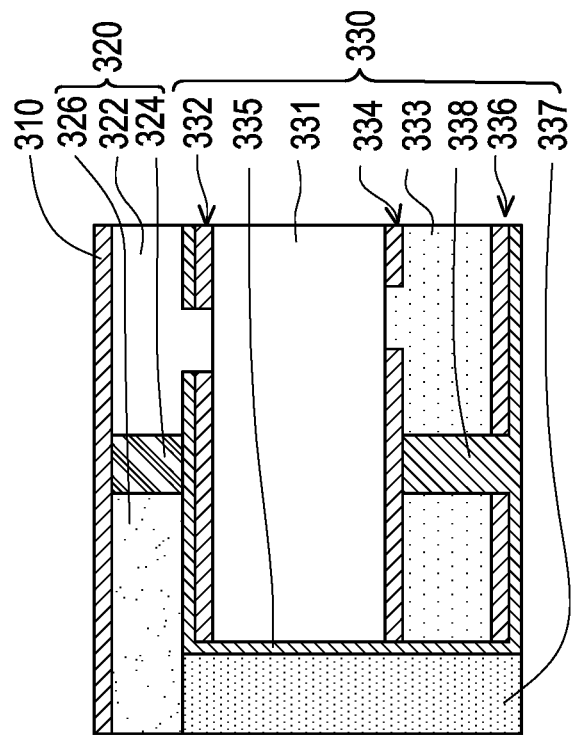
Figure 7J:
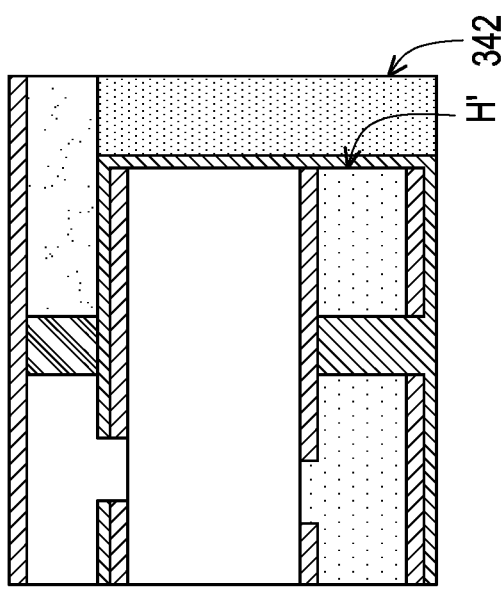
Figure 7K:
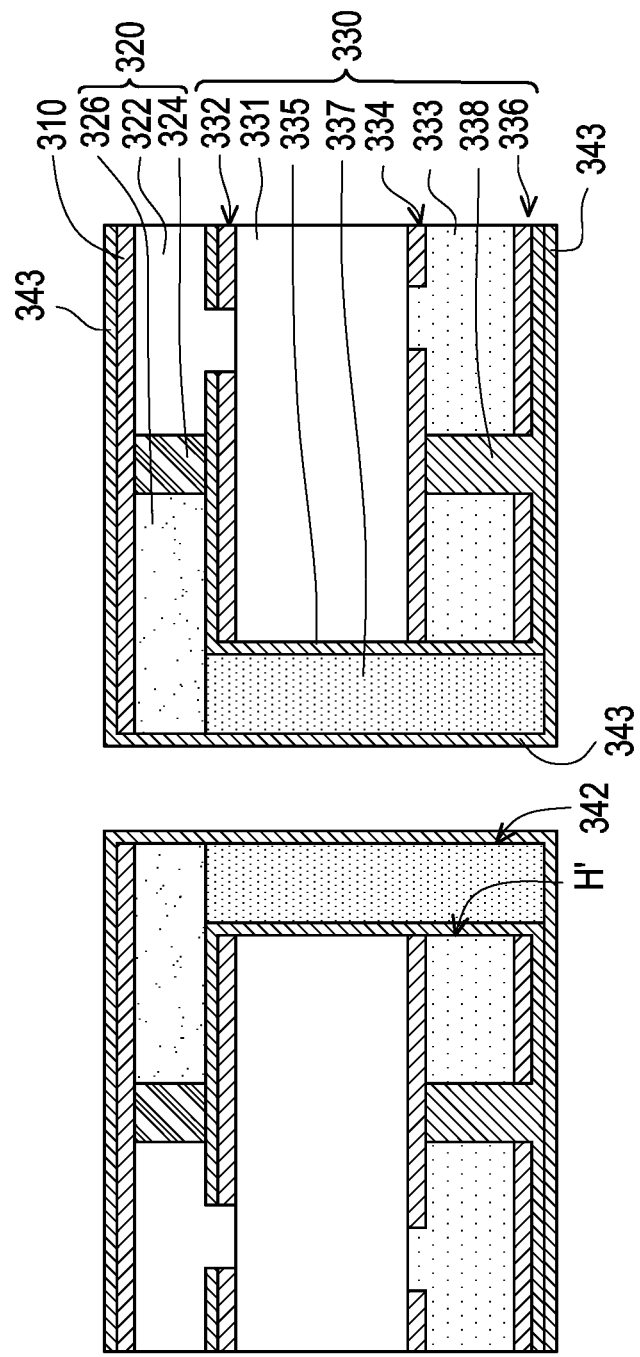

Next, referring to FIG. 7J, a via 342 is formed to penetrate the metal layer 310, the first dielectric material 326, and the second dielectric material 337. Referring to FIG. 7K, a conductive material layer 343 is formed to cover an inner wall of the via 342. The conductive material layer 343 further extends to cover on the metal layer 310 and the third circuit layer 336.

Figure 7L:
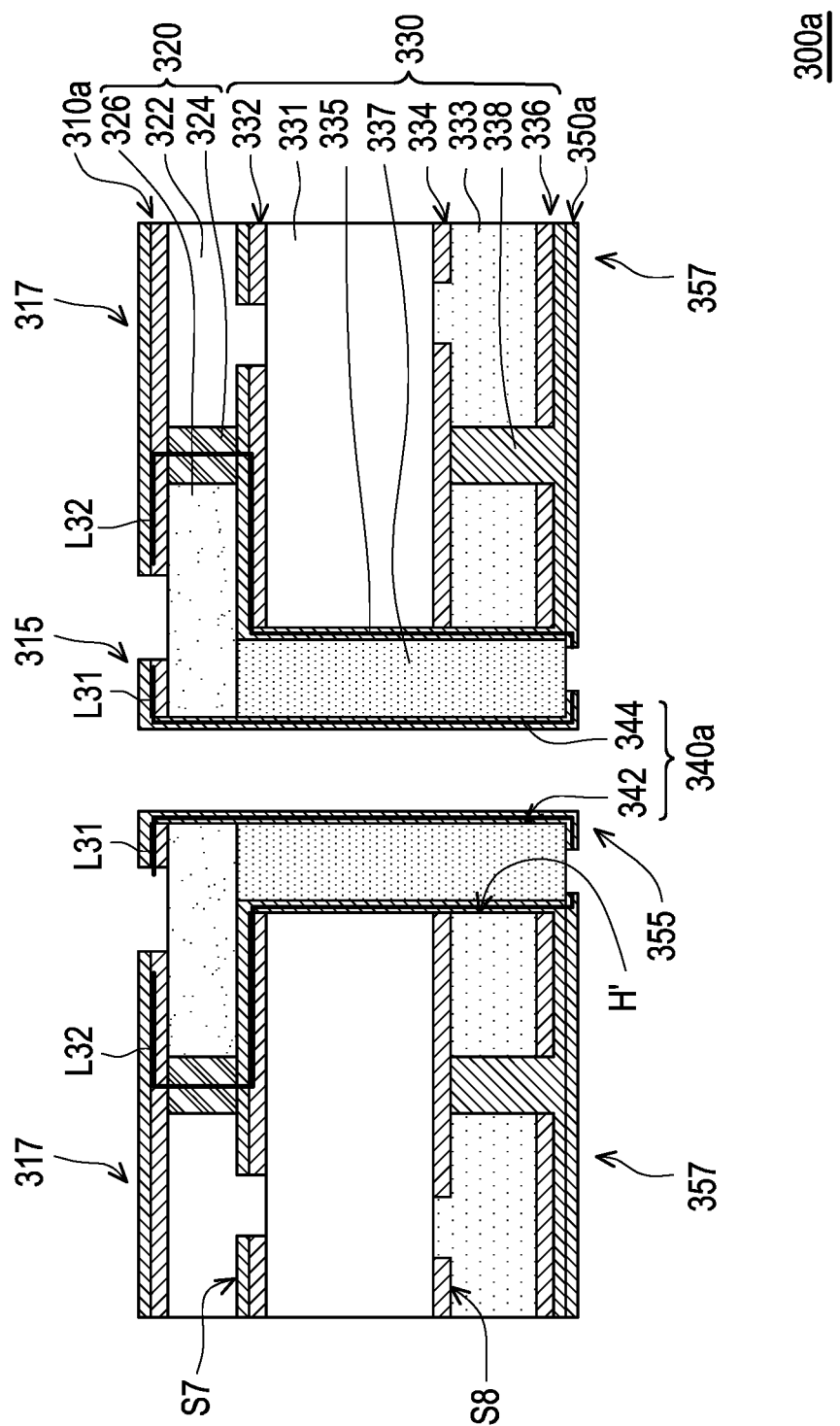

Next, referring to FIG. 7K and FIG. 7L together, the conductive material layer 343 and the metal layer 310 are patterned to form a first external circuit layer 310a on the first base material 320, a second external circuit layer 350a on the second base material 330, and a conductive via structure 340a penetrating the first dielectric material 326 and the second dielectric material 337. The first external circuit layer 310a is formed on the first substrate 322, the first conductive pillars 324, and the first dielectric material 326 of the first base material 320 and is electrically connected to the first conductive pillars 324 and the conductive via structure 340a. The second external circuit layer 350a is formed on the third circuit layer 336 of the second base material 330 and is electrically connected to the third circuit layer 336 and the conductive via structure 340a. Particularly, the first external circuit layer 310a includes a first signal circuit 315 and a first ground circuit 317. The second external circuit layer 350a includes a second signal circuit 355 and a second ground circuit 357. The first signal circuit 315, the conductive via structure 340a, and the second signal circuit 355 define a signal path L31. The first ground circuit 317, the first conductive pillars 324, the first circuit layer 332, the conductive connection layer 335, and the second ground circuit 357 define the ground path L32. The ground path L32 surrounds the signal path L31. The manufacture of a circuit board 300a is completed.

With respect to a structure, referring to FIG. 1E and FIG. 7L, the circuit board 300a is similar to the circuit board 100a above, and the difference lies in the following. In the embodiment, the circuit board 300a does not include the third base material 140, and the via 342 of the conductive via structure 340a penetrates the first dielectric material 326 of the first base material 320 and the second dielectric material 337 of the second base material 330. A conductive material layer 344 of the conductive via structure 340a covers the inner wall of the via 342 and is electrically connected to the first external circuit layer 310a and the second external circuit layer 350a. Specifically, the circuit board 300a includes the first external circuit layer 310a, the first base material 320, the second base material 330, the conductive via structure 340a, and the second external circuit layer 350a. The first base material 320 includes the first substrate 322, the first dielectric material 326, and the first conductive pillars 324. The first dielectric material 326 and the first conductive pillars 324 penetrate the first substrate 322, and the first conductive pillars 324 are located between the first substrate 322 and the first dielectric material 326. The first conductive pillars 324 surround the first dielectric material 326. The second base material 330 includes the second substrate 331, the second dielectric material 337, the third dielectric material 333, the first circuit layer 332, the second circuit layer 334, the third circuit layer 336, the conductive connection layer 335, the via 338, and the opening H'. The second substrate 331 has the first surface S7 and the second surface S8 opposite to each other. The first circuit layer 332 and the second circuit layer 334 are respectively located on the first surface S7 and the second surface S8. The second circuit layer 334 is located between the first circuit layer 332 and the third circuit layer 336. The third dielectric material 333 is located at the second surface S8 of the second substrate 331. The third circuit layer 336 is located on the third dielectric material 333. The via 338 penetrates the third dielectric material 333 and is electrically connected to the first circuit layer 334 and the third circuit layer 336. The opening H' penetrates the second substrate 331 and the third dielectric material 333. The conductive connection layer 335 covers the inner wall of the opening H' and is electrically connected to the first circuit layer 332, the second circuit layer 334, and the third circuit layer 336. The opening H' is fully filled with the second dielectric material 337, and the conductive connection layer 335 surrounds the second dielectric material 337. Here, the conductive structures include the first conductive pillars 324, the via 338, the first circuit layer 332, the second circuit layer 334, the third circuit layer 336, and the conductive connection layer 335.

In summary, in the embodiment, the signal path L31 defined by the first signal circuit 315, the conductive via structure 340a, and the second signal circuit 355 is surrounded by the ground path L32 defined by the first ground circuit 317, the first conductive pillars 324, the first circuit layer 332, the conductive connection layer 335, and the second ground circuit 357. That is, the ground path L32 with favorable closure is provided around the signal path L31 capable of transmitting the high-frequency and high speed signal such as the 5G signal so that the favorable high-frequency and high speed circuit may be formed and the circuit board 300a of the embodiment may exhibit favorable signal integrity. In addition, the conductive via structure 340a, the conductive connection layer 335 and the second dielectric material 337 of the second base material 330 define a coaxial via. The second dielectric material 337 is located between the conductive via structure 340a and the conductive connection layer 335. Compared to the conventional technology in which an inner conductor layer and an outer conductor layer of a coaxial via are blocked through a build-up process of press-fitting an insulating layer, the manufacturing method of the circuit board 300a of the embodiment may prevent high-frequency signal integrity from being affected by impedance mismatch.

Figure 8A:
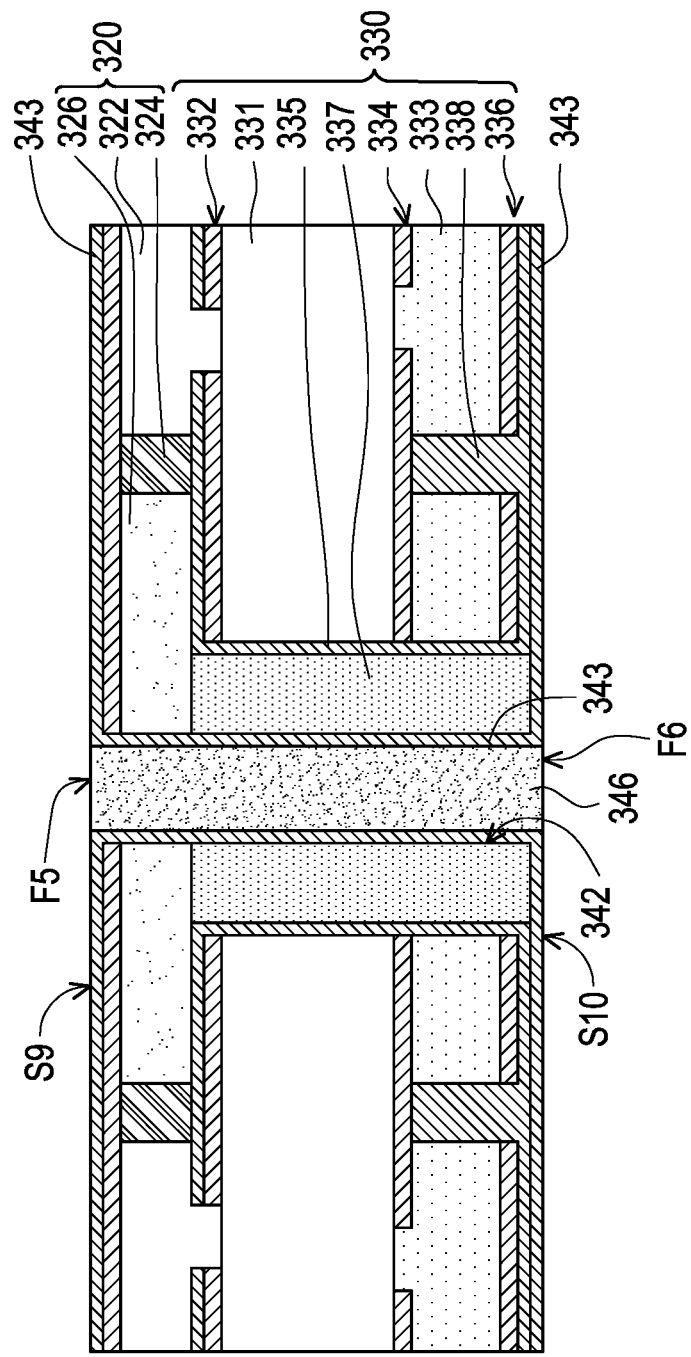
FIG. 8A to FIG. 8B are schematic cross-sectional diagrams of some steps of another manufacturing method of a circuit board according to another embodiment of the disclosure.
Figure 8B:
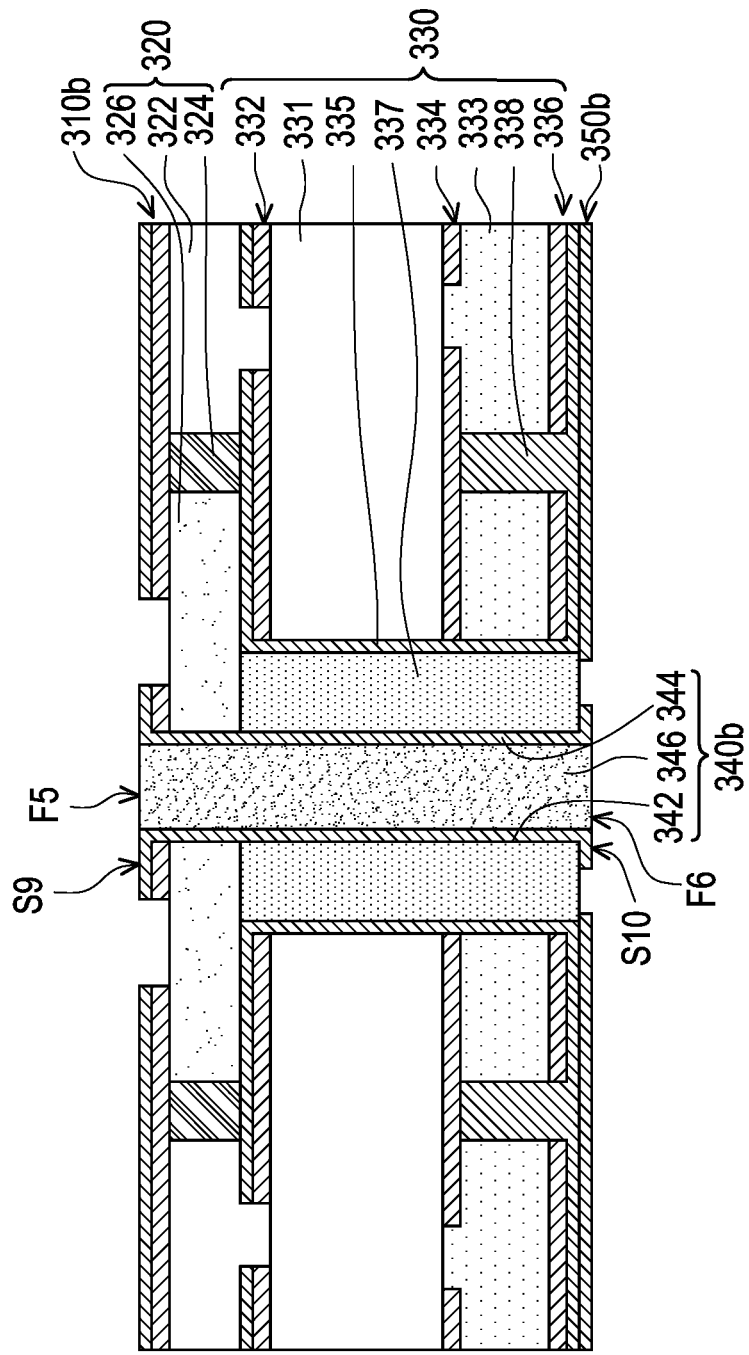

FIG. 8A to FIG. 8B are schematic cross-sectional diagrams of some steps of another manufacturing method of a circuit board according to another embodiment of the disclosure. Referring to FIG. 7K and FIG. 8A together, the manufacturing method of the circuit board in the embodiment is similar to the manufacturing method of the circuit board above, and the difference lies in the following. After forming the conductive material layer 343 as shown in FIG. 7K, referring to FIG. 8A, the plugging process is performed to fill a dielectric layer 346 in the via 342. The via 342 is fully filled with the dielectric layer 346. An upper surface F5 and a lower surface F6 of the dielectric layer 346 that are opposite to each other may be respectively flush with a top surface S9 and a bottom surface S10 of the conductive material layer 343. If the dielectric layer 346 is higher than the top surface S9 and the bottom surface S10 of the conductive material layer 343, the polishing method may be alternatively adopted so that the upper surface F5 and the lower surface F6 of the dielectric layer 346 are respectively flush with the top surface S9 and the bottom surface S10 of the conductive material layer 343. A material of the dielectric layer 346 may be resin and viewed as a plugging agent or a dielectric material with a dielectric constant greater than 3.6 and a dielectric dissipation factor less than 0.05 so that the insulating property and proper impedance matching may be provided.

Next, referring to FIG. 8A and FIG. 8B together, the lithography process is performed to pattern the conductive material layer 343 and the metal layer 310 to form a first external circuit layer 310b and a second external circuit layer 350b. The first external circuit layer 310b is located on the first substrate 322 of the first base material 320 and has the top surface S9. The second external circuit layer 350b is located on the third substrate 336 of the second base material 330 and has the bottom surface S10. The upper surface F5 and the lower surface F6 of the dielectric layer 346 that are opposite to each other are respectively flush with the top surface S9 of the first external circuit layer 310b and the bottom surface S10 of the second external circuit layer 350b. A conductive via structure 340b includes the via 342, the conductive material layer 344, and the dielectric layer 346 located in the via 342. The manufacture of a circuit board 300b is completed.

Figure 9A:
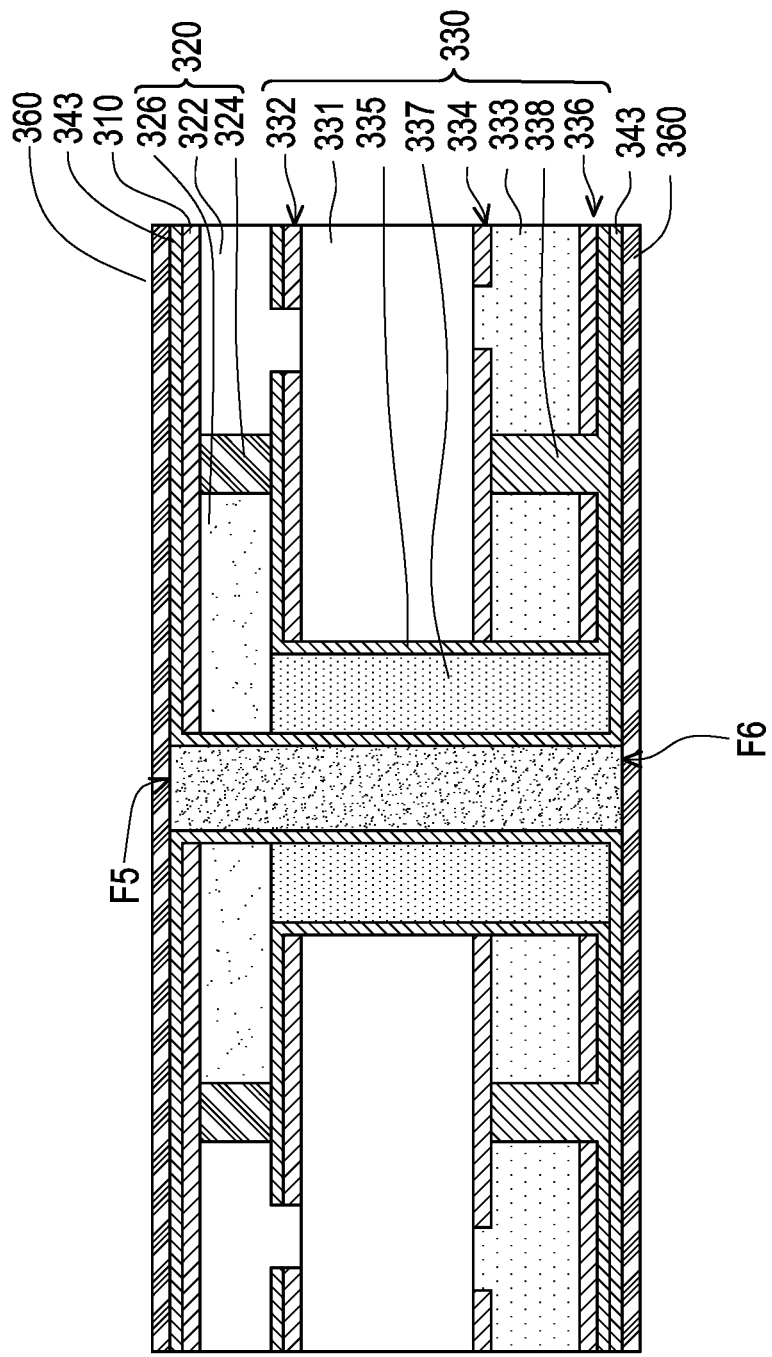
FIG. 9A to FIG. 9B are schematic cross-sectional diagrams of some steps of another manufacturing method of a circuit board according to another embodiment of the disclosure.
Figure 9B:
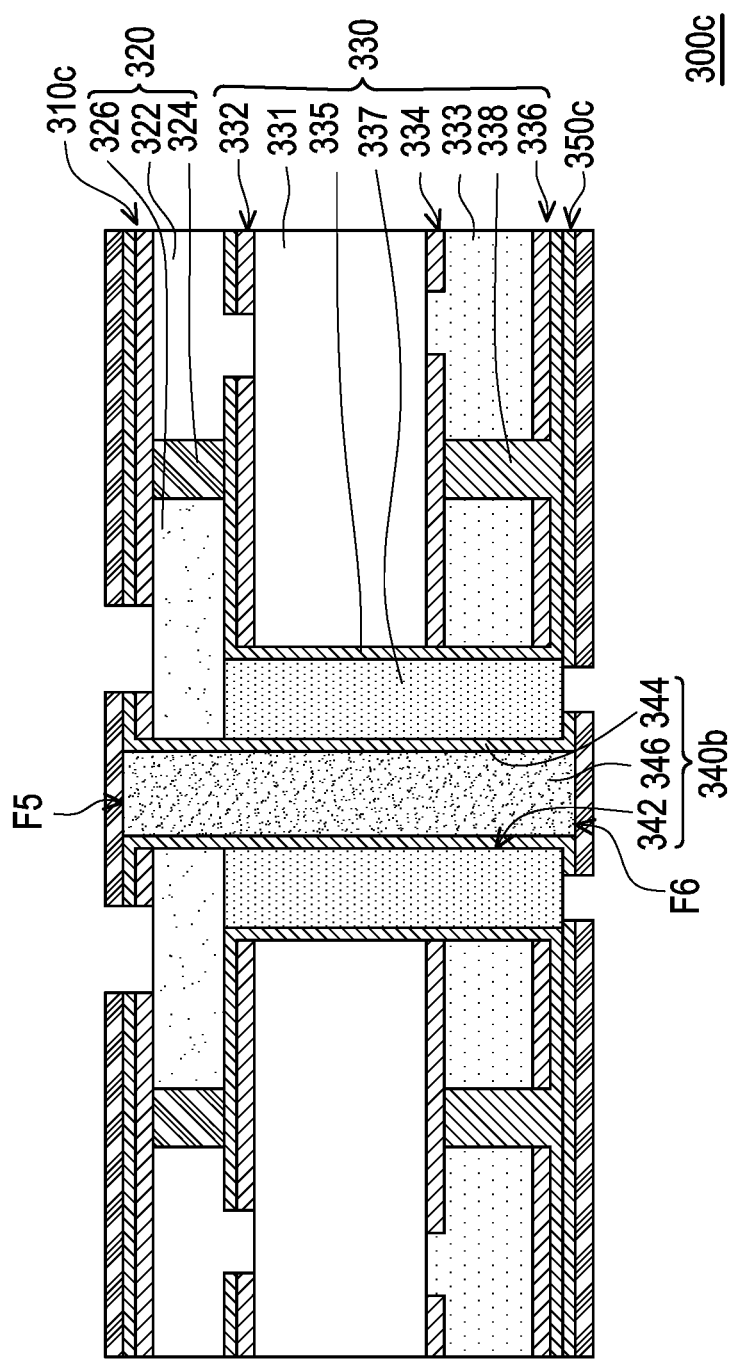

FIG. 9A to FIG. 9B are schematic cross-sectional diagrams of some steps of another manufacturing method of a circuit board according to another embodiment of the disclosure. Referring to FIG. 8A and FIG. 9A together, the manufacturing method of the circuit board in the embodiment is similar to the manufacturing method of the circuit board above, and the difference lies in the following. After filling the dielectric layer 346 in the via 342 as shown in FIG. 8A, referring to FIG. 9A, a capping layer 360 is formed on the conductive material layer 343. The capping layer 360 covers the conductive material layer 343 and the upper surface F5 and the lower surface F6 of the dielectric layer 346. A material of the capping layer 360 is, for example, copper; however, the disclosure is not limited thereto. Next, referring to FIG. 9A and FIG. 9B together, the lithography process is performed to pattern the capping layer 360, the conductive material layer 343, the metal layer 310 to form a first external circuit layer 310c and a second external circuit layer 350c. The first external circuit layer 310c and the second external circuit layer 350c respectively cover the upper surface F5 and the lower surface F6 of the dielectric layer 346 that are opposite to each other. The manufacture of a circuit board 300c is completed.

Figure 10A:
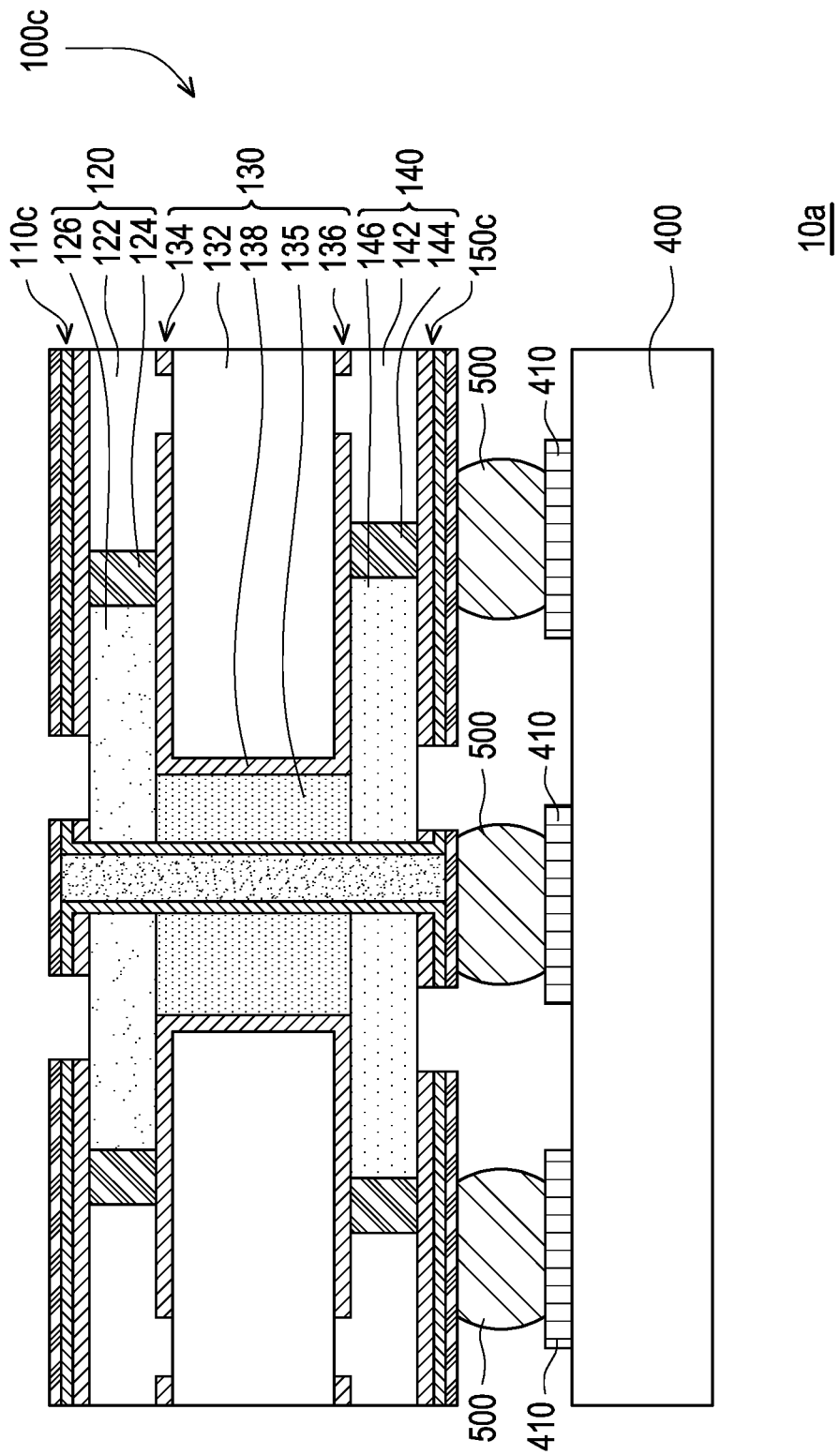
FIG. 10A to FIG. 10C are schematic cross-sectional diagrams of multiple electronic devices according to multiple embodiments of the disclosure.
Figure 10B:
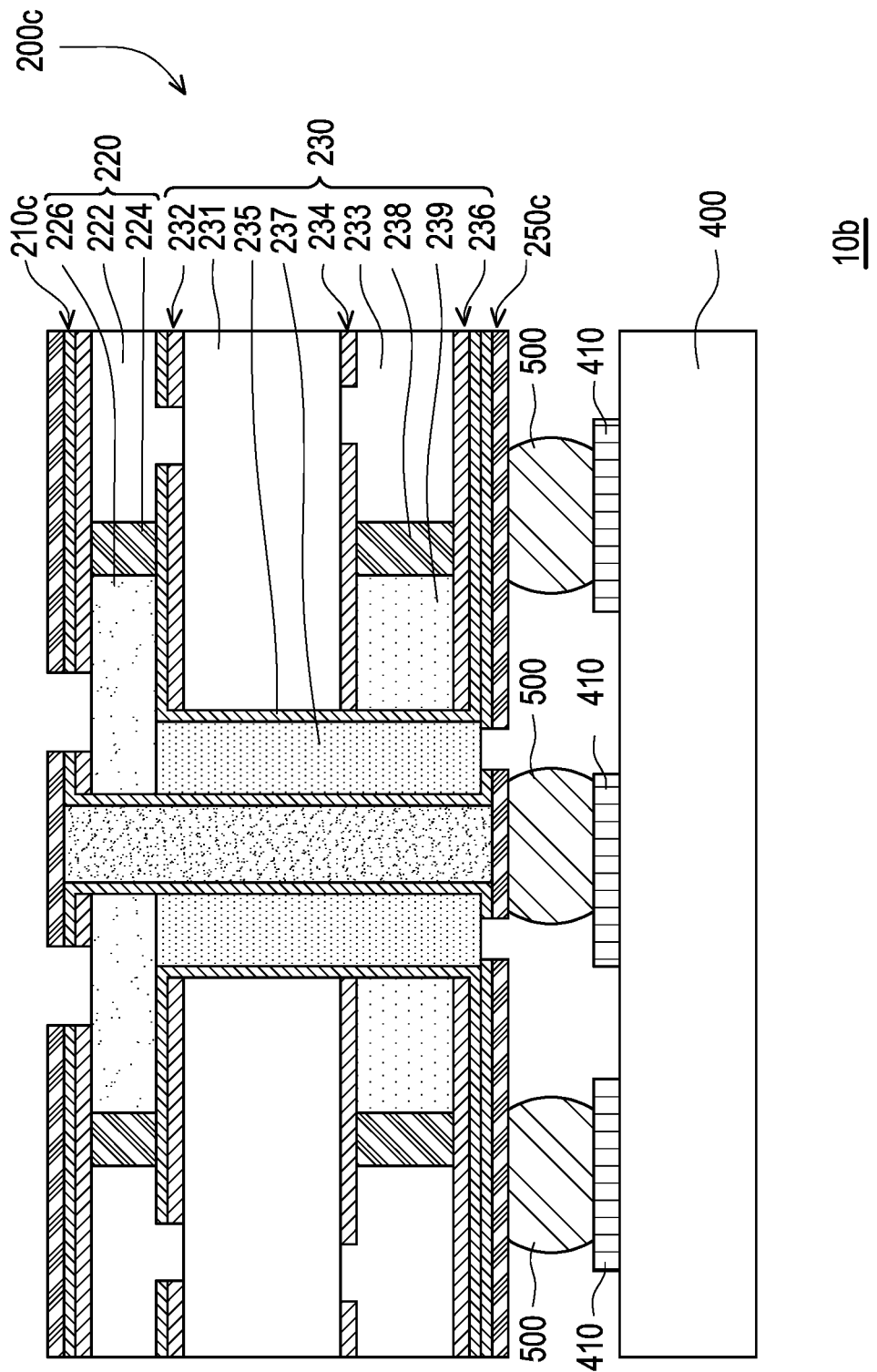
Figure 10C:
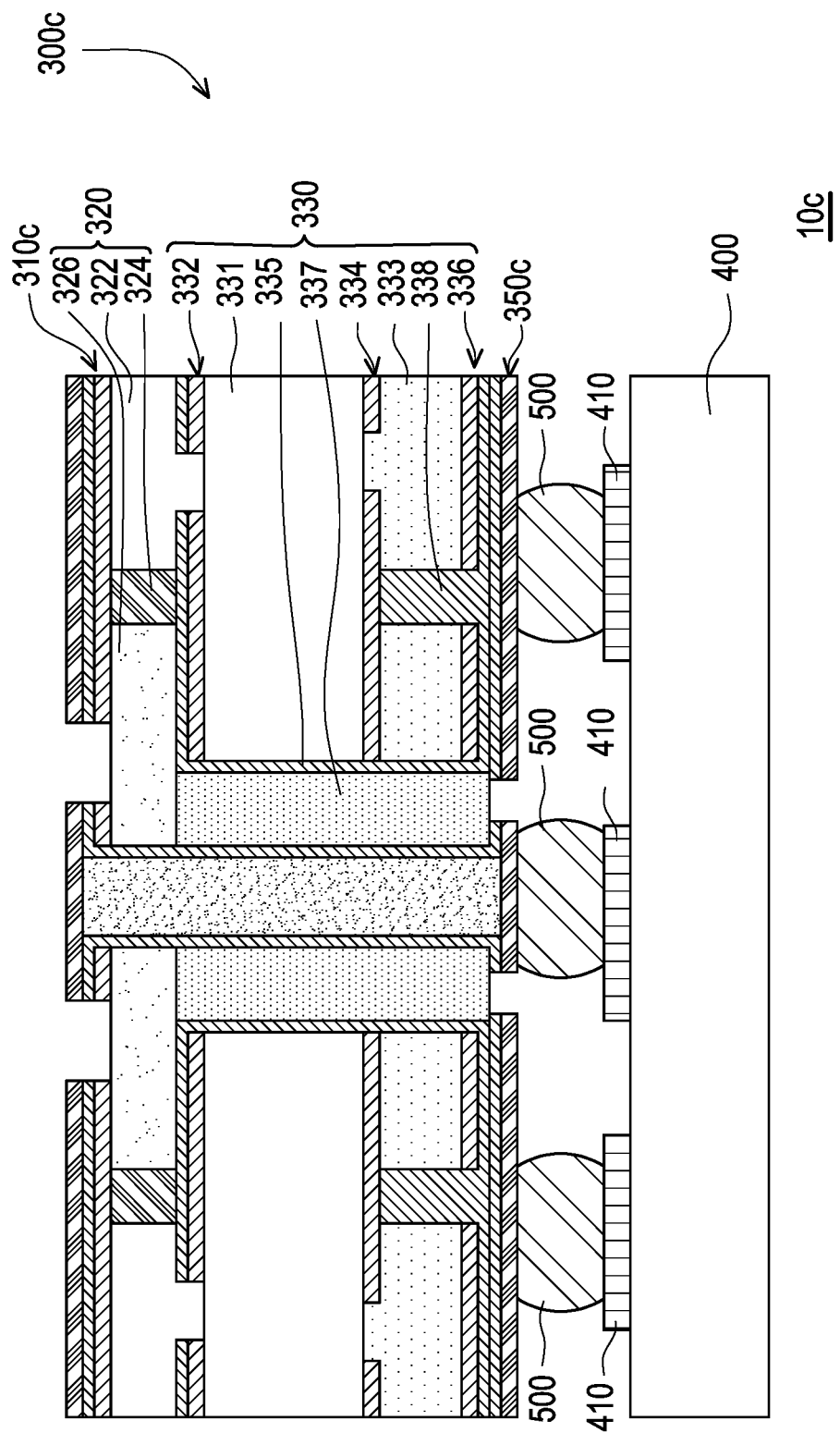

FIG. 10A to FIG. 10C are schematic cross-sectional diagrams of multiple electronic devices according to multiple embodiments of the disclosure. Referring to FIG. 10A first, in the embodiment, an electronic device 10a includes, for example, the circuit board 100c of FIG. 3B and an electronic device 400. The electronic device 400 is electrically connected to the circuit board 100c. The electronic device 400 includes multiple pads 410. In addition, the electronic device 10a of the embodiment further includes multiple connection members 500 disposed between the second external circuit layer 150c of the circuit board 100c and the pads 410 of the electronic device 400. The electronic device 400 is electrically connected to the circuit board 100c through the connection members 500. The connection members 500 are, for example, solder balls; however, the disclosure is not limited thereto. In application, an antenna structure may be provided at another side of the circuit board 100c opposite to the electronic device 400, and the antenna structure and the first external circuit layer 110c of the circuit board 100c are electrically connected. In application of integrated circuit and antennas, in the circuit board 100c of the embodiment, signal interference on the same plane may be eliminated. Signal energy loss may and noise interference may be reduced to enhance the reliability of signal transmission.

Next, referring to FIG. 10B, in the embodiment, an electronic device 10b includes, for example, the circuit board 200c of FIG. 6B and the electronic device 400. The electronic device 400 is electrically connected to the circuit board 200c. The electronic device 400 includes the multiple pads 410. In addition, the electronic device 10b of the embodiment further includes the multiple connection members 500 disposed between the second external circuit layer 250c of the circuit board 200c and the pads 410 of the electronic device 400. The electronic device 400 is electrically connected to the circuit board 200c through the connection members 500. The connection members 500 are, for example, the solder balls; however, the disclosure is not limited thereto. In application, an antenna structure may be provided at another side of the circuit board 200c opposite to the electronic device 400, and the antenna structure and the first external circuit layer 210c of the circuit board 200c are electrically connected. In application of integrated circuit and antennas, in the circuit board 200c of the embodiment, signal interference on the same plane may be eliminated. Signal energy loss may and noise interference may be reduced to enhance the reliability of signal transmission.

Lastly, referring to FIG. 10C, in the embodiment, an electronic device 10c includes, for example, the circuit board 300c of FIG. 9B and the electronic device 400. The electronic device 400 is electrically connected to the circuit board 300c. The electronic device 400 includes the multiple pads 410. In addition, the electronic device 10c of the embodiment further includes the multiple connection members 500 disposed between the second external circuit layer 350c of the circuit board 300c and the pads 410 of the electronic device 400. The electronic device 400 is electrically connected to the circuit board 300c through the connection members 500. The connection members 500 are, for example, the solder balls; however, the disclosure is not limited thereto. In application, an antenna structure may be provided at another side of the circuit board 300c opposite to the electronic device 400, and the antenna structure and the first external circuit layer 310c of the circuit board 300c are electrically connected. In application of integrated circuit and antennas, in the circuit board 300c of the embodiment, signal interference on the same plane may be eliminated. Signal energy loss may and noise interference may be reduced to enhance the reliability of signal transmission.

In summary of the above, in the design of the circuit board of the disclosure, the conductive via structure is electrically connected to the first external circuit layer and the second external circuit layer to define the signal path. The conductive structures are electrically connected to each other and are electrically connected to the first external circuit layer and the second external circuit layer to define the ground path. The ground path surrounds the signal path. Hence, the favorable high-frequency and high speed signal circuit may be formed, and in further application of integrated circuit and antennas, signal interference on the same plane may be eliminated. Signal energy loss may and noise interference may be reduced to enhance the reliability of signal transmission. In addition, the conductive via structure of the disclosure at least penetrates the first dielectric material and the second dielectric material. That is, by providing dielectric materials with different dielectric constants around the conductive via structure, signal transmission speed may be increased and signal transmission loss may be reduced.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A circuit board comprising a first dielectric material, a second dielectric material, a third dielectric material, a first external circuit layer, a second external circuit layer, a plurality of conductive structures, and a conductive via structure, wherein the second dielectric material is located between the first dielectric material and the third dielectric material, and a dielectric constant of the first dielectric material is different from a dielectric constant of the second dielectric material and a dielectric constant of the third dielectric material;

the first external circuit layer is disposed on the first dielectric material;

the second external circuit layer is disposed on the third dielectric material;

the conductive via structure at least penetrates the first dielectric material and the second dielectric material and is electrically connected to the first external circuit layer and the second external circuit layer to define a signal path; and the conductive structures are electrically connected to each other and surround the first dielectric material, the second dielectric material, and the third dielectric material, and the conductive structures are electrically connected to the first external circuit layer and the second external circuit layer to define a ground path, wherein the ground path surrounds the signal path.

2. The circuit board according to claim 1, wherein the conductive structures comprise a plurality of first conductive pillars, a plurality of second conductive pillars, a first circuit layer, a second circuit layer, and a conductive connection layer, the first conductive pillars surround the first dielectric material, the second conductive pillars surround the third dielectric material, and the conductive connection layer is connected to the first circuit layer and the second circuit layer and surrounds the second dielectric material.

3. The circuit board according to claim 2, further comprising:

a first base material comprising a first substrate, the first dielectric material, and the first conductive pillars, wherein the first dielectric material and the first conductive pillars penetrate the first substrate, and the first conductive pillars are located between the first substrate and the first dielectric material;

a second base material comprising a second substrate, the second dielectric material, the first circuit layer, the second circuit layer, and the conductive connection layer, wherein the second substrate has a first surface and a second surface opposite to each other and an opening, the opening penetrates the second substrate, the first circuit layer and the second circuit layer are respectively located on the first surface and the second surface, the conductive connection layer covers an inner wall of the opening and is electrically connected to the first circuit layer and the second circuit layer, and the opening is fully filled with the second dielectric material; and a third base material comprising a third substrate, the third dielectric material, and the second conductive pillars, wherein the third dielectric material and the second conductive pillars penetrate the third substrate, and the second conductive pillars are located between the third substrate and the third dielectric material.

4. The circuit board according to claim 3, wherein the first external circuit layer comprises a first signal circuit and a first ground circuit, the second external circuit layer comprises a second signal circuit and a second ground circuit, the first signal circuit, the conductive via structure, and the second signal circuit define the signal path, and the first ground circuit, the first conductive pillars, the first circuit layer, the conductive connection layer, the second circuit layer, the second conductive pillars, and the second ground circuit define the ground path.

5. The circuit board according to claim 3, wherein the conductive via structure comprises a via and a conductive material layer, the via penetrates the first dielectric material, the second dielectric material, and the third dielectric material, and the conductive material layer covers an inner wall of the via and is electrically connected to the first external circuit layer and the second external circuit layer.

6. The circuit board according to claim 5, wherein the conductive via structure further comprises a dielectric layer fully filling the via, and an upper surface and a lower surface of the dielectric layer opposite to each other are respectively flush with a top surface of the first external circuit layer and a bottom surface of the second external circuit layer.

7. The circuit board according to claim 5, wherein the conductive via structure further comprises a dielectric layer fully filling the via, and the first external circuit layer and the second external circuit layer respectively cover an upper surface and a lower surface of the dielectric layer opposite to each other.

8. The circuit board according to claim 3, wherein a dielectric constant of the first substrate and a dielectric constant of the third substrate are respectively greater than 3.6, and a dielectric dissipation factor of the first substrate and a dielectric dissipation factor of the third substrate are respectively less than 0.02.

9. The circuit board according to claim 1, wherein the conductive structures comprise a plurality of first conductive pillars, a plurality of second conductive pillars, a first circuit layer, a second circuit layer, a third circuit layer, and a conductive connection layer, the first conductive pillars surround the first dielectric material, the second conductive pillars surround the third dielectric material, the second circuit layer is located between the first circuit layer and the third circuit layer, and the conductive connection layer is connected to the first circuit layer, the second circuit layer, and the third layer and surrounds the second dielectric material.

10. The circuit board according to claim 9, further comprising:
a first base material comprising a first substrate, the first dielectric material, and the first conductive pillars, wherein the first dielectric material and the first conductive pillars penetrate the first substrate, and the first conductive pillars are located between the first substrate and the first dielectric material; and
a second base material comprising a second substrate, a third substrate, the second dielectric material, the third dielectric material, the first circuit layer, the second circuit layer, the third circuit layer, the conductive connection layer, the second conductive pillars, and an opening, wherein the second substrate has a first surface and a second surface opposite to each other, the first circuit layer and the second circuit layer are respectively located on the first surface and the second surface, the third substrate and the third dielectric material are located on the second surface of the second substrate, the third circuit layer is located on the third substrate and the third dielectric material, the second conductive pillars are electrically connected to the second circuit layer and the third circuit layer, the opening penetrates the second substrate and the third dielectric material, the conductive connection layer covers an inner wall of the opening and is electrically connected to the first circuit layer, the second circuit layer, and the third layer, and the opening is fully filled with the second dielectric material.

11. The circuit board according to claim 10, wherein the first external circuit layer comprises a first signal circuit and a first ground circuit, the second external circuit layer comprises a second signal circuit and a second ground circuit, the first signal circuit, the conductive via structure, and the second signal circuit define the signal path, and the first ground circuit, the first conductive pillars, the first circuit layer, the conductive connection layer, and the second ground circuit define the ground path.

12. The circuit board according to claim 10, wherein the conductive via structure comprises a via and a conductive material layer, the via penetrates the first dielectric material and the second dielectric material, and the conductive material layer covers an inner wall of the via and is electrically connected to the first external circuit layer and the second external circuit layer.

13. The circuit board according to claim 12, wherein the conductive via structure further comprises a dielectric layer fully filling the via, and an upper surface and a lower surface of the dielectric layer opposite to each other are respectively flush with a top surface of the first external circuit layer and a bottom surface of the second external circuit layer.

14. The circuit board according to claim 13, wherein a dielectric constant of the dielectric layer is greater than 3.6, and a dielectric dissipation factor of the dielectric layer is less than 0.05.

15. The circuit board according to claim 12, wherein the conductive via structure further comprises a dielectric layer fully filling the via, and the first external circuit layer and the second external circuit layer respectively cover an upper surface and a lower surface of the dielectric layer opposite to each other.

16. The circuit board according to claim 15, wherein a dielectric constant of the dielectric layer is greater than 3.6, and a dielectric dissipation factor of the dielectric layer is less than 0.05.

17. The circuit board according to claim 1, wherein the conductive structures comprise a plurality of first conductive pillars, a plurality of conductive vias, a first circuit layer, a second circuit layer, a third circuit layer, and a conductive connection layer, the first conductive pillars surround the first dielectric material, the conductive vias penetrate the third dielectric material, the second circuit layer is located between the first circuit layer and the third circuit layer, and the conductive connection layer is connected to the first circuit layer, the second circuit layer, and the third layer and surrounds the second dielectric material.

18. The circuit board according to claim 17, further comprising:
a first base material comprising a first substrate, the first dielectric material, and the first conductive pillars, wherein the first dielectric material and the first conductive pillars penetrate the first substrate, and the first conductive pillars are located between the first substrate and the first dielectric material; and
a second base material comprising a second substrate, the second dielectric material, the third dielectric material, the first circuit layer, the second circuit layer, the third circuit layer, the conductive connection layer, the conductive vias, and an opening, wherein the second substrate has a first surface and a second surface opposite to each other, the first circuit layer and the second circuit layer are respectively located on the first surface and the second surface, the third dielectric material are located on the second surface of the second substrate, the third circuit layer is located on the third dielectric material, the conductive vias are electrically connected to the second circuit layer and the third circuit layer, the opening penetrates the second substrate and the third dielectric material, the conductive connection layer covers an inner wall of the opening and is electrically connected to the first circuit layer, the second circuit layer, and the third circuit layer, and the opening is fully filled with the second dielectric material.

19. The circuit board according to claim 18, wherein the first external circuit layer comprises a first signal circuit and a first ground circuit, the second external circuit layer comprises a second signal circuit and a second ground circuit, the first signal circuit, the conductive via structure, and the second signal circuit define the signal path, and the first ground circuit, the first conductive pillars, the first circuit layer, the conductive connection layer, and the second ground circuit define the ground path.

20. The circuit board according to claim 18, wherein the conductive via structure comprises a via and a conductive material layer, the via penetrates the first dielectric material and the second dielectric material, and the conductive material layer covers an inner wall of the via and is electrically connected to the first external circuit layer and the second external circuit layer.

21. The circuit board according to claim 20, wherein the conductive via structure further comprises a dielectric layer fully filling the via, and an upper surface and a lower surface of the dielectric layer opposite to each other are respectively flush with a top surface of the first external circuit layer and a bottom surface of the second external circuit layer.

22. The circuit board according to claim 20, wherein the conductive via structure further comprises a dielectric layer fully filling the via, and the first external circuit layer and the second external circuit layer respectively cover an upper surface and a lower surface of the dielectric layer opposite to each other.

23. The circuit board according to claim 1, wherein a dielectric constant of the first dielectric material and a dielectric constant of the third dielectric material are respectively less than 3.2, a dielectric dissipation factor of the first dielectric material and a dielectric dissipation factor of the third dielectric material are respectively greater than 0 and less than 0.006, a dielectric constant of the second dielectric material is less than 3.4, and a dielectric dissipation factor of the second dielectric material is greater than 0 and less than 0.008.

24. A manufacturing method of a circuit board, the method comprising:
   forming a plurality of conductive structures to surround a first dielectric material, a second dielectric material, and a third dielectric material;
   press-fitting the first dielectric material, the second dielectric material, and the third dielectric material, wherein the second dielectric material is located between the first dielectric material and the third dielectric material, a dielectric constant of the first dielectric material is different from a dielectric constant of the second dielectric material and a dielectric constant of the third dielectric material, and the conductive structures are electrically connected to each other;
   forming a conductive via structure to at least penetrate the first dielectric material and the second dielectric material; and
   forming a first external circuit layer and a second external circuit layer respectively on the first dielectric material and the third dielectric material, wherein the first external circuit layer, the second external circuit layer, and the conductive via structure are electrically connected to define a signal path, and the conductive structures are electrically connected to the first external circuit layer and the second external circuit layer to define a ground path, wherein the ground path surrounds the signal path.

25. The manufacturing method of the circuit board according to claim 24, wherein the conductive structures comprise a plurality of first conductive pillars, a plurality of second conductive pillars, a first circuit layer, a second circuit layer, and a conductive connection layer, the first conductive pillars surround the first dielectric material, the second conductive pillars surround the third dielectric material, and the conductive connection layer is connected to the first circuit layer and the second circuit layer and surrounds the second dielectric material.

26. The manufacturing method of the circuit board according to claim 25, wherein forming the conductive structures to surround the first dielectric material, the second dielectric material, and the third dielectric material comprises:
   providing a first base material, wherein the first base material comprises a first substrate, the first dielectric material, and the first conductive pillars, wherein the first dielectric material and the first conductive pillars penetrate the first substrate, and the first conductive pillars are located between the first substrate and the first dielectric material;
   providing a second base material, wherein the second base material comprises a second substrate, the second dielectric material, the first circuit layer, the second circuit layer, and the conductive connection layer, wherein the second substrate has a first surface and a second surface opposite to each other and an opening, the opening penetrates the second substrate, the first circuit layer and the second circuit layer are respectively located on the first surface and the second surface, the conductive connection layer covers an inner wall of the opening and is electrically connected to the first circuit layer and the second circuit layer, and the opening is fully filled with the second dielectric material; and
   providing a third base material, wherein the third base material comprises a third substrate, the third dielectric material, and the second conductive pillars, wherein the third dielectric material and the second conductive pillars penetrate the third substrate, and the second conductive pillars are located between the third substrate and the third dielectric material.

27. The manufacturing method of the circuit board according to claim 26, wherein forming the conductive via structure to at least penetrate the first dielectric material and the second dielectric material comprises:
   forming a via to penetrate the first dielectric material, the second dielectric material, and the third dielectric material; and
   forming a conductive material layer to cover an inner wall of the via.

28. The manufacturing method of the circuit board according to claim 27, wherein forming the first external circuit layer and the second external circuit layer respectively on the first dielectric material and the third dielectric material comprises:

in response to press-fitting the first dielectric material, the second dielectric material, and the third dielectric material, respectively press-fitting a first metal layer and a second metal layer on the first base material and the third base material;

in response to forming the conductive material layer, the conductive material layer further extending to cover on the first metal layer and the second metal layer; and patterning the conductive material layer, the first metal layer, and the second metal layer to form the first external circuit layer and the second external circuit layer.

29. The manufacturing method of the circuit board according to claim 28, the method further comprising:

after forming the conductive material layer and before patterning the conductive material layer, the first metal layer, and the second metal layer, filling a dielectric layer in the via, wherein the via is fully filled with the dielectric layer, and an upper surface and a lower surface of the dielectric layer opposite to each other are respectively flush with a top surface and a bottom surface of the conductive material layer.

30. The manufacturing method of the circuit board according to claim 29, the method further comprising:

after filling the dielectric layer in the via and before patterning the conductive material layer, the first metal layer, and the second metal layer, forming a capping layer on the conductive material layer, wherein the capping layer covers the conductive material layer and the upper surface and the lower surface of the dielectric layer; and patterning the capping layer, the conductive material layer, the first metal layer, and the second metal layer to form the first external circuit layer and the second external circuit layer.

31. The manufacturing method of the circuit board according to claim 24, wherein the conductive structures comprise a plurality of first conductive pillars, a plurality of second conductive pillars, a first circuit layer, a second circuit layer, a third circuit layer, and a conductive connection layer, the first conductive pillars surround the first dielectric material, the second conductive pillars surround the third dielectric material, the second circuit layer is located between the first circuit layer and the third circuit layer, and the conductive connection layer is connected to the first circuit layer, the second circuit layer, and the third layer and surrounds the second dielectric material.

32. The manufacturing method of the circuit board according to claim 31, wherein forming the conductive structures to surround the first dielectric material, the second dielectric material, and the third dielectric material comprises:

forming a first base material, wherein the first base material comprises a first substrate, the first dielectric material, and the first conductive pillars, wherein the first dielectric material and the first conductive pillars penetrate the first substrate, and the first conductive pillars are located between the first substrate and the first dielectric material; and providing a second base material, wherein the second base material comprises a second substrate, a third substrate, the second dielectric material, the third dielectric material, the first circuit layer, the second circuit layer, the third circuit layer, the conductive connection layer, the second conductive pillars, and an opening, wherein the second substrate has a first surface and a second surface opposite to each other, the first circuit layer and the second circuit layer are respectively located on the first surface and the second surface, the third substrate and the third dielectric material are located on the second surface of the second substrate, the third circuit layer is located on the third substrate and the third dielectric material, the second conductive pillars are electrically connected to the second circuit layer and the third circuit layer, the opening penetrates the second substrate and the third dielectric material, the conductive connection layer covers an inner wall of the opening and is electrically connected to the first circuit layer, the second circuit layer, and the third circuit layer, and the opening is fully filled with the second dielectric material.

33. The manufacturing method of the circuit board according to claim 32, wherein forming the conductive via structure to at least penetrate the first dielectric material and the second dielectric material comprises:

forming a via to penetrate the first dielectric material and the second dielectric material; and forming a conductive material layer to cover an inner wall of the via.

34. The manufacturing method of the circuit board according to claim 33, wherein forming the first external circuit layer and the second external circuit layer respectively on the first dielectric material and the third dielectric material comprises:

in response to press-fitting the first dielectric material, the second dielectric material, and the third dielectric material, press-fitting a metal layer on the first base material;

in response to forming the conductive material layer, the conductive material layer further extending to cover on the metal layer and the third circuit layer; and patterning the conductive material layer and the metal layer to form the first external circuit layer and the second external circuit layer.

35. The manufacturing method of the circuit board according to claim 34, the method further comprising:

after forming the conductive material layer and before patterning the conductive material layer and the metal layer, filling a dielectric layer in the via, wherein the via is fully filled with the dielectric layer, and an upper surface and a lower surface of the dielectric layer opposite to each other are respectively flush with a top surface and a bottom surface of the conductive material layer.

36. The manufacturing method of the circuit board according to claim 35, the method further comprising:

after filling the dielectric layer in the via and before patterning the conductive material layer and the metal layer, forming a capping layer on the conductive material layer, wherein the capping layer covers the conductive material layer and the upper surface and the lower surface of the dielectric layer; and patterning the capping layer, the conductive material layer, and the metal layer to form the first external circuit layer and the second external circuit layer.

37. The manufacturing method of the circuit board according to claim 24, wherein the conductive structures comprise a plurality of first conductive pillars, a plurality of conductive vias, a first circuit layer, a second circuit layer, a third circuit layer, and a conductive connection layer, the first conductive pillars surround the first dielectric material, the conductive vias penetrate the third dielectric material, the second circuit layer is located between the first circuit layer and the third circuit layer, and the conductive connection layer is connected to the first circuit layer, the second circuit layer, and the third circuit layer and surrounds the second dielectric material.

38. The manufacturing method of the circuit board according to claim 37, wherein forming the conductive structures to surround the first dielectric material, the second dielectric material, and the third dielectric material comprises:
forming a first base material, wherein the first base material comprises a first substrate, the first dielectric material, and the first conductive pillars, wherein the first dielectric material and the first conductive pillars penetrate the first substrate, and the first conductive pillars are located between the first substrate and the first dielectric material; and
forming a second base material, wherein the second base material comprises a second substrate, the second dielectric material, the third dielectric material, the first circuit layer, the second circuit layer, the third circuit layer, the conductive connection layer, the conductive vias, and an opening, wherein the second substrate has a first surface and a second surface opposite to each other, the first circuit layer and the second circuit layer are respectively located on the first surface and the second surface, the third dielectric material is located on the second surface of the second substrate, the third circuit layer is located on the third dielectric material, the conductive vias are electrically connected to the second circuit layer and the third circuit layer, the opening penetrates the second substrate and the third dielectric material, the conductive connection layer covers an inner wall of the opening and is electrically connected to the first circuit layer, the second circuit layer, and the third circuit layer, and the opening is fully filled with the second dielectric material.

39. The manufacturing method of the circuit board according to claim 38, wherein forming the conductive via structure to at least penetrate the first dielectric material and the second dielectric material comprises:
forming a via to penetrate the first dielectric material and the second dielectric material; and
forming a conductive material layer to cover an inner wall of the via.

40. The manufacturing method of the circuit board according to claim 39, wherein forming the first external circuit layer and the second external circuit layer respectively on the first dielectric material and the third dielectric material comprises:
in response to press-fitting the first dielectric material, the second dielectric material, and the third dielectric material, press-fitting a metal layer on the first base material;
in response to forming the conductive material layer, the conductive material layer further extending to cover on the metal layer and the third circuit layer; and
patterning the conductive material layer and the metal layer to form the first external circuit layer and the second external circuit layer.

41. The manufacturing method of the circuit board according to claim 40, the method further comprising:
after forming the conductive material layer and before patterning the conductive material layer and the metal layer, filling a dielectric layer in the via, wherein the via is fully filled with the dielectric layer, and an upper surface and a lower surface of the dielectric layer opposite to each other are respectively flush with a top surface and a bottom surface of the conductive material layer.

42. The manufacturing method of the circuit board according to claim 41, the method further comprising:
after filling the dielectric layer in the via and before patterning the conductive material layer and the metal layer, forming a capping layer on the conductive material layer, wherein the capping layer covers the conductive material layer and the upper surface and the lower surface of the dielectric layer; and
patterning the capping layer, the conductive material layer, and the metal layer to form the first external circuit layer and the second external circuit layer.

43. An electronic device, comprising:
a circuit board comprising a first dielectric material, a second dielectric material, a third dielectric material, a first external circuit layer, a second external circuit layer, a plurality of conductive structures, and a conductive via structure, wherein
the second dielectric material is located between the first dielectric material and the third dielectric material, and a dielectric constant of the first dielectric material is different from a dielectric constant of the second dielectric material and a dielectric constant of the third dielectric material;
the first external circuit layer is disposed on the first dielectric material;
the second external circuit layer is disposed on the third dielectric material;
the conductive via structure at least penetrates the first dielectric material and the second dielectric material and is electrically connected to the first external circuit layer and the second external circuit layer to define a signal path; and
the conductive structures are electrically connected to each other and surround the first dielectric material, the second dielectric material, and the third dielectric material, and the conductive structures are electrically connected to the first external circuit layer and the second external circuit layer to define a ground path, wherein the ground path surrounds the signal path; and
an electronic element electrically connected to the circuit board.

* * * * *